(12) United States Patent
Yada et al.

(10) Patent No.: US 7,075,469 B2
(45) Date of Patent: Jul. 11, 2006

(54) SEMICONDUCTOR INTEGRATED CIRCUIT

(75) Inventors: Naoki Yada, Tokorozawa (JP);
Yasuyuki Saito, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/246,170

(22) Filed: Oct. 11, 2005

(65) Prior Publication Data

US 2006/0022863 A1 Feb. 2, 2006

Related U.S. Application Data

(63) Continuation of application No. 10/878,250, filed on Jun. 29, 2004, now Pat. No. 6,975,262.

(30) Foreign Application Priority Data

Jun. 30, 2003 (JP) .............................. 2003-187566

(51) Int. Cl.
*H03M 1/78* (2006.01)

(52) U.S. Cl. ........................ 341/154; 341/155; 341/144

(58) Field of Classification Search ................ 341/154, 341/155, 126, 136, 144, 145, 156
See application file for complete search history.

(56) References Cited

U.S. PATENT DOCUMENTS

| | | | | |
|---|---|---|---|---|
| 5,583,503 A | | 12/1996 | Kusakabe | .................... 341/161 |
| 5,798,725 A | * | 8/1998 | Okada | ......................... 341/158 |
| 5,877,719 A | | 3/1999 | Matsui et al. | ................ 341/155 |
| 6,181,269 B1 | * | 1/2001 | Nishiuchi et al. | ............ 341/164 |
| 6,459,399 B1 | | 10/2002 | Nozaki | ........................ 341/155 |
| 6,583,745 B1 | * | 6/2003 | Sakakibara et al. | .......... 341/155 |

FOREIGN PATENT DOCUMENTS

| | | |
|---|---|---|
| JP | 9-321627 | 12/1997 |
| JP | 2002-111461 | 4/2002 |

* cited by examiner

*Primary Examiner*—John B Nguyen
(74) *Attorney, Agent, or Firm*—Miles & Stockbridge P.C.

(57) ABSTRACT

A semiconductor integrated circuit including an A/D converter capable of converting an analog signal accepted through an external terminal into a digital signal. The A/D converter includes: a ladder-type resistor for generating a reference voltage; a set of first operational amplifiers, each accepts an output voltage of the ladder-type resistor; a set of first switches, each capable of short-circuiting an input terminal and an output terminal of corresponding one of the first operational amplifiers thereby to allow an offset correction of the corresponding first operational amplifier to be made; and a comparator circuit for comparing an output voltage of each of the first operational amplifiers with the analog signal. The A/D converter can reduce a current output from the ladder-type resistor and speed up charge and discharge of the sampling capacitor.

25 Claims, 20 Drawing Sheets

SEMICONDUCTOR INTEGRATED CIRCUIT

CLAIM OF PRIORITY

This application is a continuation of application Ser. No. 10/878,250 filed Jun. 29, 2004, now U.S. Pat. No. 6,975,262.

The present application claims priority from Japanese application JP 2003-187566 filed on Jun. 30, 2003, the content of which is hereby incorporated by reference into this application.

BACKGROUND OF THE INVENTION

The present invention relates to a semiconductor integrated circuit, and a technique intended to increase conversion speeds of A/D (analog-to-digital) converter and D/A (digital-to-analog) converter and shorten the conversion times thereof, for example, a technique useful in applications to microcomputers.

In a semiconductor integrated circuit including an A/D converter and D/A converter, especially in a microcomputer, an analog signal entered from the outside is converted into a digital signal in the A/D converter and then supplied to the CPU (central processing unit). In addition, the result of an operation process in the CPU may be converted into an analog signal by the D/A converter to output. Regarding such A/D converter, as a technique for reducing the influence of a previously entered voltage in the places of an analog switch, a sample hold circuit for analog input voltages and an analog multiplexer, there has been known a technique characterized in: an analog switch circuit is constituted by an insulated gate transistor and a voltage follower circuit connected in parallel with the transistor; and when the switch circuit is turned on, the voltage follower is first activated and then the transistor is brought to conduction (see par. 22 of Japanese Unexamined Patent Application Publication JP-A-2002-111461, for example).

Also, there has been known an A/D converter in which a differential-amplifying device is provided between a terminal for supplying a baseline voltage (i.e., reset voltage) and an input gate included by a differential amplifier in a comparison circuit, for the purpose of making smaller the apparent input capacitance of the comparison circuit when viewed from the input side thereby to increase its working speed and decrease power consumption, and in which the differential-amplifying device makes a voltage follower when a switch for feedback turns on in its reset operation (see JP-A-9-321627 (esp. FIG. 1), for example).

SUMMARY OF THE INVENTION

From our study, the inventor recognized the following. That is, the speed-up of processing speed and reduction in error in a conversion process are important, considering that the conversion process time is longer relative to the sampling time of an A/D converter, e.g., the fact the A/D converter requires a conversion process time of about 10 microseconds relative to a sampling time of 3.2 microseconds. However, this is not described in JP-A-2002-111461.

Further, for the purpose of speeding up a process time for A/D conversion in an A/D converter having a ladder-type resistor for generating a reference voltage, it is required to decrease the impedance of the ladder-type resistor. However, it is undesirable to decrease the impedance of the ladder-type resistor because decreasing the impedance increases power consumption in the ladder-type resistor and makes the device more sensitive to process variations. Moreover, in order to improve the precision of the conversion process, the sampling capacitance must be made larger to make the device resistant to noises. In that case, the conversion process speed would become slower because it takes longer times for charging and discharging of the sampling capacitance.

It is an object of the invention to provide a technique for shortening a process time for A/D conversion without decreasing the impedance of the ladder-type resistor itself.

The foregoing and other objects of the invention and its novel features will be made clear from the description hereof and the accompanying drawings.

The outlines of the representative examples of the invention disclosed herein, will be described briefly as follows.

One of such representative examples is a semiconductor integrated circuit having: an external terminal for accepting an analog signal; and an A/D converter capable of converting the analog signal accepted through the external terminal into a digital signal, the A/D converter including a ladder-type resistor for generating a reference voltage, a set of first operational amplifiers, each accepts an output voltage of the ladder-type resistor, a set of first switches, each capable of short-circuiting an input terminal and an output terminal of corresponding one of the first operational amplifiers thereby to allow an offset correction of the corresponding first operational amplifier to be made, and a comparator circuit for comparing an output voltage of each of the first operational amplifier with the analog signal.

According to the above-described representative example, the set of first operational amplifiers are interposed, and the load of the ladder-type resistor is used as the input impedance of the first operational amplifier, thereby reducing a current output from the ladder-type resistor. In addition, the charge and discharge of the sampling capacitor can be performed at a high speed by a low impedance output of the first operational amplifier. This makes it possible to achieve a shortened process time for A/D conversion without decreasing the impedance of the ladder-type resistor itself. Further, there are provided the set of first switches SW1, SW2, each capable of short-circuiting an input terminal and an output terminal of corresponding one of the first operational amplifiers thereby to allow an offset correction of the corresponding first operational amplifier to be made; each of the first switches SW1, SW2 is used to correct the offset of the corresponding first operational amplifier. This improves charging time characteristics of the sampling capacitor.

In order to prevent a current from flowing into the output terminal of the first operational amplifier through the corresponding first switch, each of the first operational amplifiers and the corresponding first switch may be actuated according to non-overlapping signals with respective timings different from each other.

In the case where the first switch connected in parallel with the corresponding first operational amplifier is brought into conduction to carry out the charge and discharge, the output impedance of the ladder-type resistor comes into sight electrically and as such, the charge and discharge are delayed by an amount of the offset of the first operational amplifier. In order to avoid such delay, a capacitor may be provided between each node of the plurality of resistors connected in series in the ladder-type resistor and the low-potential-side power source, thereby to hold a voltage level of each node. Then, in the case where the first switch is brought into conduction to carry out the charge and discharge, the charge and discharge in the offset correction can be sped up by the corresponding capacitor sharing a charge.

When each first operational amplifier starts to work from its standby condition, it takes a lot of time before the bias voltage level of each part is stabilized. Therefore, a standby control signal is held at its high level to keep the first operational amplifier in operation during conversion, whereby the first operational amplifier can take an amplifying action rapidly. In order to avoid unwanted voltage transmission to the comparator circuit during this time, the output terminal of each first operational amplifier is brought to its high impedance condition by an output control signal.

A rail-to-rail type operational amplifier can be caused to fluctuate in its output amplitude up to its source voltage level. Therefore, in order to transmit a reference voltage produced by the ladder-type resistor to the comparator circuit with high precision, a rail-to-rail type operational amplifier may be adopted as the first operational amplifier.

Possible means in order to improve a SN (signal-to-noise) ratio of a sensor used as an analog signal source are: placing a series resistor (of tens to hundreds of thousands of ohms) between analog input terminals of the A/D converter and the sensor to use the series resistor as a filter circuit or an anti-overvoltage circuit; and using a sensor circuit having an impedance of tens to hundreds of thousands of ohms as an entire analog signal source. In such cases, a second operational amplifier may be interposed between the external terminal and the comparator circuit thereby to reduce a current output from the analog signal source. In addition, when there is provided a second switch capable of short-circuiting an input terminal and an output terminal of the second operational amplifier thereby to allow an offset correction of the second operational amplifier to be made, the precision of conversion can be improved by carrying out the offset correction. In order to prevent a current from flowing into the output terminal of the second operational amplifier through the second switch during this time, the second operational amplifier and the second switch may be actuated according to non-overlapping signals with respective timings different from each other. The second operational amplifier may include a second transfer circuit for bringing the output terminal to its high impedance condition according to an input control signal. Further, the second operational amplifier may be of rail-to-rail type.

Further, when there are provided: a D/A converter for converting an input digital signal into an analog signal; and a third operational amplifier placed in a subsequent stage of the D/A converter for driving an external load based on an output of the D/A converter, a current output from the D/A converter can be reduced. Also, the third operational amplifier allows the external load to be driven at a high speed. In addition, there may be a third switch capable of short-circuiting an input terminal and an output terminal of the third operational amplifier thereby to allow an offset correction of the third operational amplifier to be made. The third operational amplifier and third switch may be actuated according to non-overlapping signals with respective timings different from each other. The third operational amplifier may include a third transfer circuit for bringing the output terminal to its high impedance condition according to an input control signal. The third operational amplifier may be of rail-to-rail type.

DESCRIPTION OF THE PREFERRED EMBODIMENTS

Figure 2:
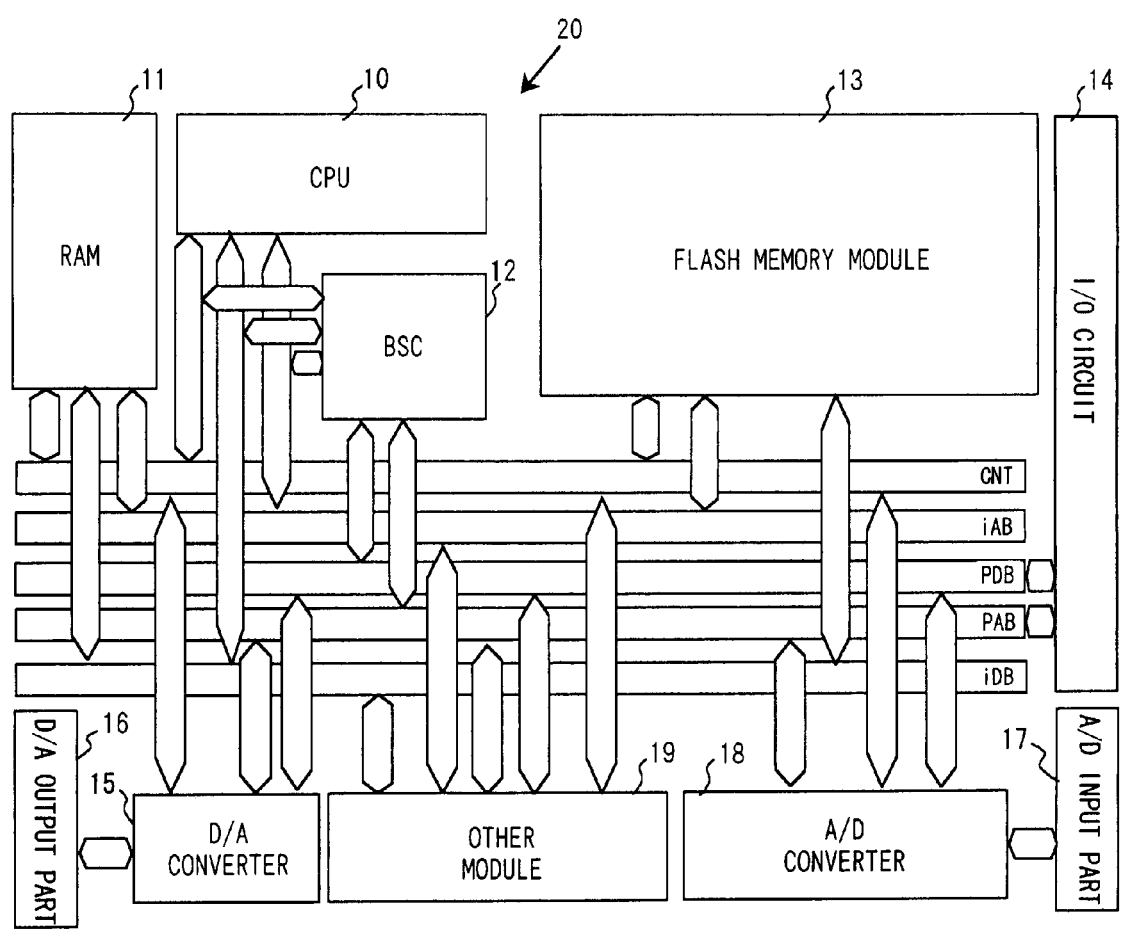
FIG. 2 is a block diagram showing an example of the entire configuration of the microcomputer.

Referring to FIG. 2, there is shown an example of the configuration of a microcomputer as an example of a semiconductor integrated circuit according to the invention. While the microcomputer 20 shown in FIG. 2 is not particularly limited, the microcomputer 20 includes: a CPU (Central Processing Unit) 10 for carrying out a given operation process according to a program control method; a RAM (Random Access Memory) 11 for providing a work area for the CPU 10 and temporarily storing the data resulting from the execution of a program, etc.; a BSC (Bus State Controller) 12 for bus state control, such as weight insertion; a flash memory module 13 for storing the program the CPU 10 executes and fixed data required for control; an I/O circuit (input-output circuit) 14 for enabling various signals to be input from and output to the outside; a D/A converter 15 for converting a digital signal into an analog signal; a D/A output part 16 capable of outputting an analog signal produced in the D/A converter 15 to the outside; an A/D input part 17 for enabling an analog signal to be input from the outside; an A/D converter 18 for converting an input analog signal into a digital signal; and the other module 19, and the microcomputer 20 can be formed on a semiconductor substrate, such as a single crystal silicon substrate, by a well-known semiconductor integrated circuit manufacturing technique. Also, in the microcomputer 20, there are formed a control bus CNT for transmitting signals, an internal address bus iAB for transmitting an internal address signal, an internal data bus iDB for transmitting internal data, a peripheral address bus PAD for transmitting an address signal of a peripheral circuit, and a peripheral data bus PDB for transmitting the data of the peripheral circuit, which enables the signal exchange between the functional modules. For example, in the case where the microcomputer 20 is incorporated in a control system of a motor vehicle, analog signals from various sensors mounted in the vehicle are entered into the A/D converter 18 through the A/D input part 17, converted into the corresponding digital signals there and then supplied to the CPU 10 to be used in an operation process there. The result of the operation process may be converted into an analog signal by the D/A converter 15 and then output through the D/A output part 16 to the outside.

Figure 1:
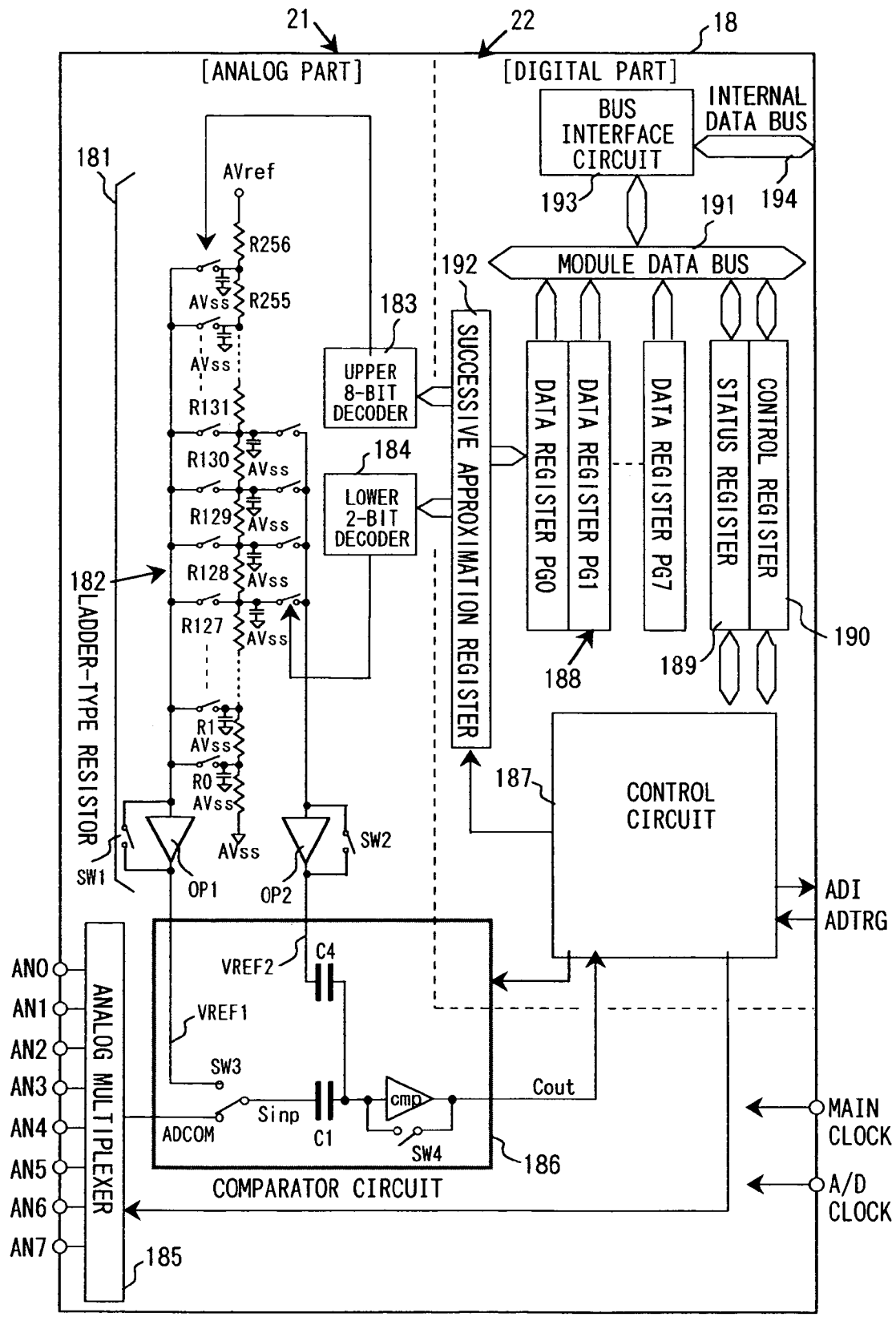
FIG. 1 is a block diagram showing an example of the configuration of an A/D converter included in a microcomputer as an example of a semiconductor integrated circuit according to the invention.

An example of the configuration of the A/D converter 18 is shown in FIG. 1. The A/D converter 18 is divided into an analog part 21 and a digital part 22.

The analog part 21 is arranged as follows.

The analog part 21 includes: a local D/A converter 181 for generating baseline voltages VREF1 and VREF2 in response to a digital signal output from the digital part 22; an analog multiplexer 185 for accepting analog signals AN0–AN7 through external terminals to selectively transmit the signals to the comparator circuit 186; and a comparator circuit 186 for comparing an analog signal ADCOM accepted through the analog multiplexer 185 with the baseline voltages VREF1, VREF2 generated in the local D/A converter 181.

The local D/A converter 181 includes: an upper 8-bit decoder 183 for decoding upper eight bits of a 10-bit digital signal output from the digital part 22; a lower 2-bit decoder 184 for decoding lower two bits of the 10-bit digital signal output from the digital part 22; an operational amplifier OP1 for transmitting a reference voltage VREF1, which has been generated based on a decoded output signal of the upper 8-bit decoder 183, to the comparator circuit 186; a transfer switch SW1 for short-circuiting an internal terminal and an output terminal of the operational amplifier OP1 thereby to enable offset correction of the operational amplifier OP1; an operational amplifier OP2 for transmitting a reference voltage VREF2, which has been generated based on a decoded output signal of the lower 2-bit decoder 184, to the comparator circuit 186; and a transfer switch SW2 for short-circuiting an input terminal and an output terminal of the operational amplifier OP2 thereby to enable offset correction of the operational amplifier OP2.

The operational amplifiers OP1 and OP2 have MOS transistors with extremely high input impedances because they receive input signals at the gate electrodes of the MOS transistors. In addition, the operational amplifiers OP1 and OP2 are extremely high in output impedance because they output signals from the source electrodes of their MOS transistors. For example, the operational amplifier OP1 can receive a reference voltage VREF1 for upper eight bits of the ladder-type resistor 182 at a high impedance, and the operational amplifier OP2 can receive a reference voltage VREF2 for lower two bits of the ladder-type resistor 182 at a high impedance. Incidentally, in the case where the local D/A converter 181 doesn't have the operational amplifiers OP1 and OP2, the ladder-type resistor 182 must drive sampling capacitors C1 and C4 in the comparator circuit 186. Contrarily, in the case where the operational amplifiers OP1 and OP2 are available, the loads when viewed from the side of the ladder-type resistor 182 correspond to the input impedances of the operational amplifiers OP1, OP2, and therefore the loads are reduced remarkably. The sampling capacitors C1, C4 of the comparator circuit 186 are driven at a high speed with low impedance outputs from the operational amplifiers OP1, OP2. This remarkably reduces a sampling time in the comparator circuit 186, thereby speeding up the A/D conversion.

Rail-to-rail type operational amplifiers are used as the operational amplifiers OP1 and OP2. Rail-to-rail type operational amplifiers can be caused to fluctuate in the output amplitudes almost up to their source voltage levels and as such, they can transmit reference voltages formed by the ladder-type resistor 182 to the comparator circuit 186 over a wide voltage range with high precision.

The digital part 22 includes: a control circuit 187; a group of data registers 188; a status register 189; a control register 190; successive approximation register 192; and a bus interface 193. The group of data registers 188, the status register 189 and the control register 190 are coupled to the bus interface 193 through a module data bus 191, and further coupled to the peripheral data bus PDB through an internal data bus 194, which enables data exchange between the different functional modules.

Figure 13:
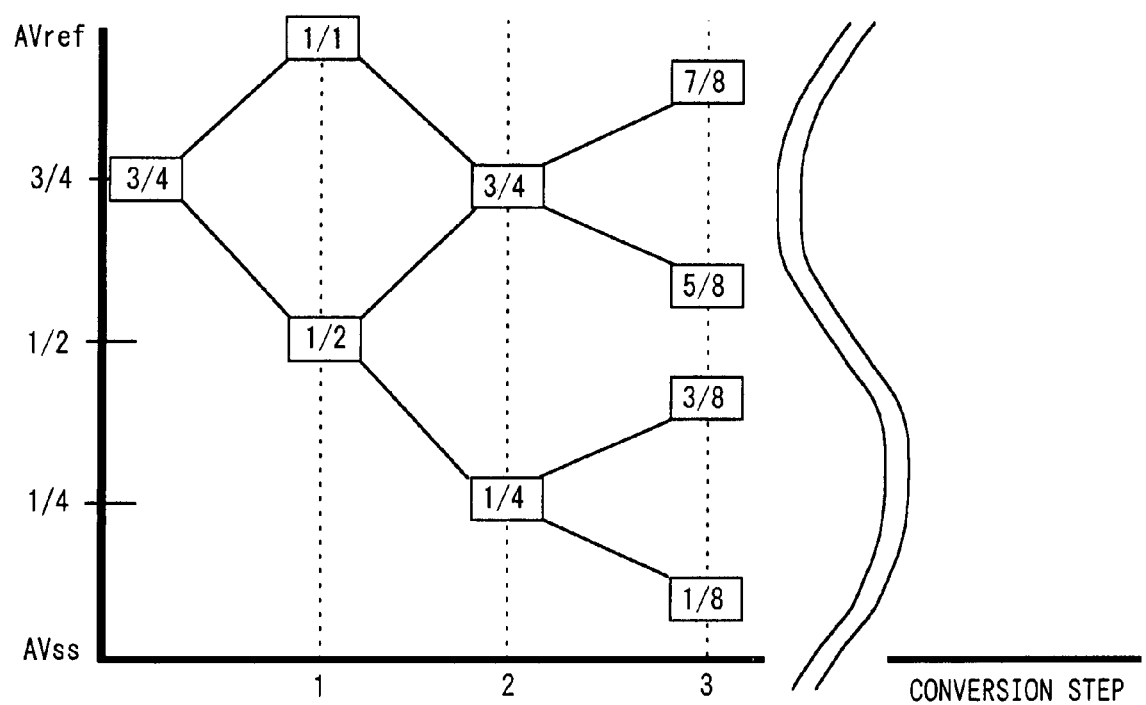
FIG. 13 is an illustration of assistance in explaining the operations of the A/D converter.

Into the successive approximation register 192, digital data for successive comparisons in the comparator circuit 186 is written by the control circuit 187. The digital data is successively updated according to results Cout of the successive comparisons in the comparator circuit 186. The successive comparisons in the comparator 186 are not particularly limited, but the comparisons are performed as shown in FIG. 13. More specifically, it is judged whether an input analog signal is larger or smaller than the value of ¾ of AVref. When the signal is judged to be larger, it is judged whether the signal is smaller than the value of ¼ of AVref. In this judgment, if the signal is judged to be smaller than the value of ¼ of AVref, then it is judged whether the signal is larger or smaller than the value of ¾ of AVref. The successive comparisons are performed in this way.

The data determined based on the successive comparisons in the comparator circuit 186 is written into the group of data registers 188. The group of data registers 188 includes eight data registers RG0–RG7 corresponding to eight lines' analog signals AN0–AN7 accepted through the external terminals. Results of the A/D conversions of the analog signals AN0–AN7 are to be written into the corresponding data registers RG0–RG7. The data in the data registers Rg0–RG7 are output through the bus interface 193 to the peripheral data bus PDB and used for the operation process in the CPU 10. In the status register 189, a status of the conversion action in the A/D converter 18 is set. And in the control register 190, control data transmitted from the CPU 10 is stored. According to the control data in the control register 190, the control circuit 187 controls, in action, the units in the A/D converter 18, such as switches in the ladder-type resistor 182, the operational amplifiers OP1, OP2 and the transfer switches SW1, SW2 for offset corrections of the amplifiers, the analog multiplexer 185, and the comparator circuit 186. The start timing of the A/D conversion is determined by an A/D conversion starting trigger signal ADTRG transmitted through the control bus CNT. When the A/D conversion is completed, an interrupt signal ADI to the CPU 10 is asserted by the control circuit 187. The CPU 10 may recognize the completion of A/D conversion through the interrupt signal ADI. Incidentally, the A/D converter 18 is actuated in synchronization with a main clock signal or an A/D clock signal transmitted through the control bus CNT.

Figure 3:
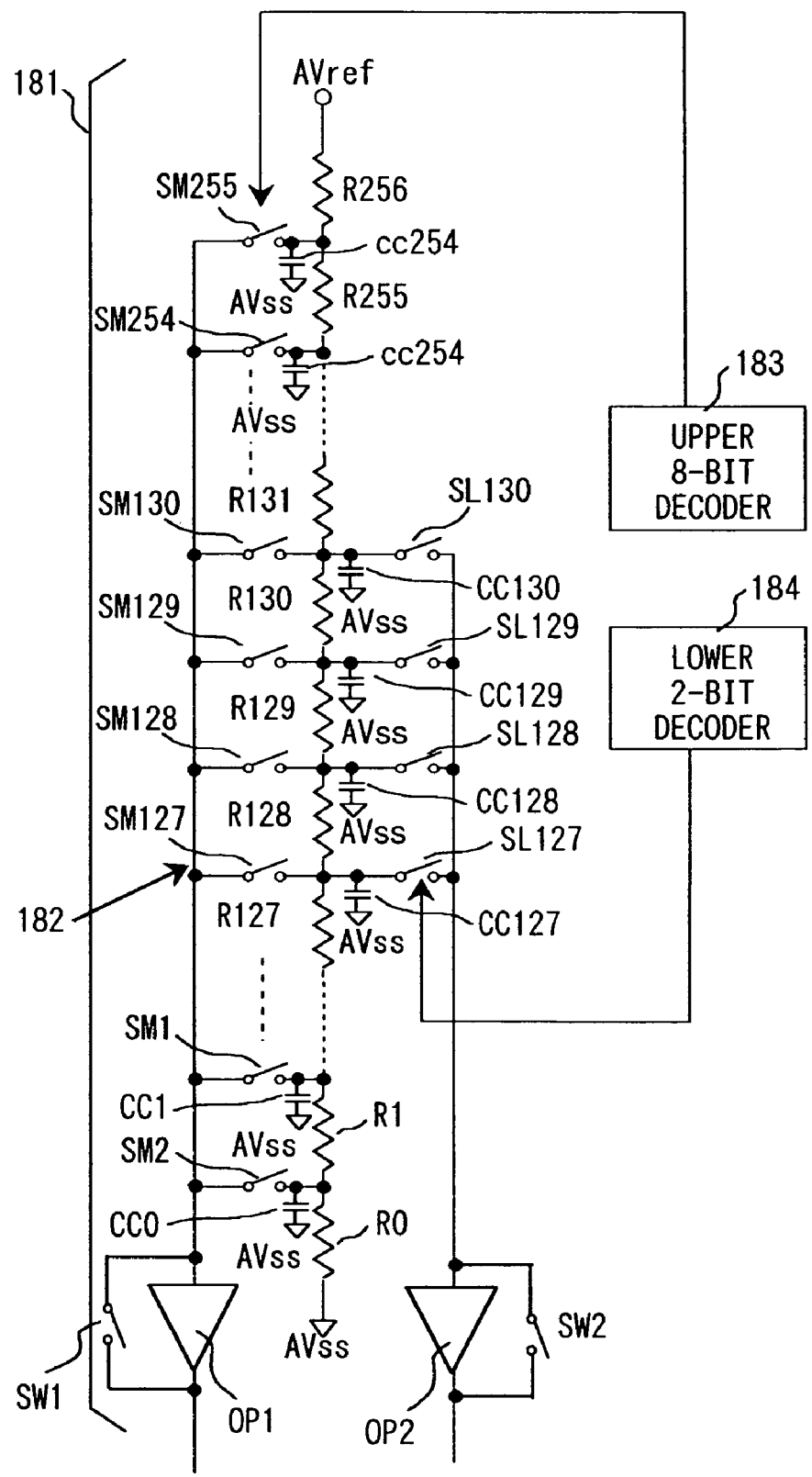
FIG. 3 is an enlarged view of a main part of the A/D converter shown in FIG. 1.

Now, details of the ladder-type resistor 182 will be described. FIG. 3 shows the ladder-type resistor 182 under magnification.

The ladder-type resistor 182 includes a plurality of resistors R0–R256 connected in series with each other. The resistors R1–R256 are of the same resistance value. The resistor R0 has a resistance value of one half that of the resistor R1. One end of the resistor R0 is coupled to the low-potential-side power source AVss; one end of the resistor R256 is coupled to the reference voltage AVref. Thus, the potential difference between the reference voltage AVref and the low-potential-side power source AVss is divided according to the resistance values of the resistors R0–R256. From the nodes at connection points of the plurality of resistors R0–R256 connected in series, there are drawn taps for outputting divided voltages; the taps are coupled to the input terminal of the operational amplifier OP1 through the respective switches SM0–SM255, each composed of a MOS transistor for selecting the tap. The switches SM0–SM255 are selectively switched based on results of decode by the upper 8-bit decoder 183. According to the switching action, a voltage (a reference voltage VREF1) at the corresponding tap is selectively transmitted to the operational amplifier OP1. Further, from a node located in a central portion of the resistors R0–R256 connected in series, there is drawn a tap for producing a voltage (VREF2) used to determine the lower two bits; the tap is coupled to the input terminal of the operational amplifier OP2 through switches SL127–SL130, each composed of an n-channel MOS transistor for selecting the tap. The switches SL127–SL130 are selectively switched based on results of decode by the lower 2-bit decoder 184. According to the switching action, a voltage (a reference voltage VREF2) at the corresponding tap is selectively transmitted to the operational amplifier OP2. In addition, there are provided capacitors CC0–CC255 between the low-potential-side power source AVss and each nodes of the plurality of resistors R0–R256 connected in series. The capacitors CC0–CC255 are charged by voltage application from the corresponding nodes and then works so as to keep a voltage level at each of the nodes. More specifically, the voltage at the tap of the ladder-type resistor 182 can drop undesirably for the following reason. That is, in the condition where the transfer switches SW1 and SW2 are conducting, the sampling capacitors C1, C4 in the comparator circuit 186 come into sight electrically from the ladder-type resistor 182, and thus a relatively large volume of current is flowed from the ladder-type resistor 182 toward the comparator circuit 186. As a measure against this, there are provided the capacitors CC0–CC255. Thus, the voltage drop at the tap can be avoided by the capacitors CC0–CC255 sharing charge in the case where the transfer switches SW1, SW2 are conducting.

Figure 4:
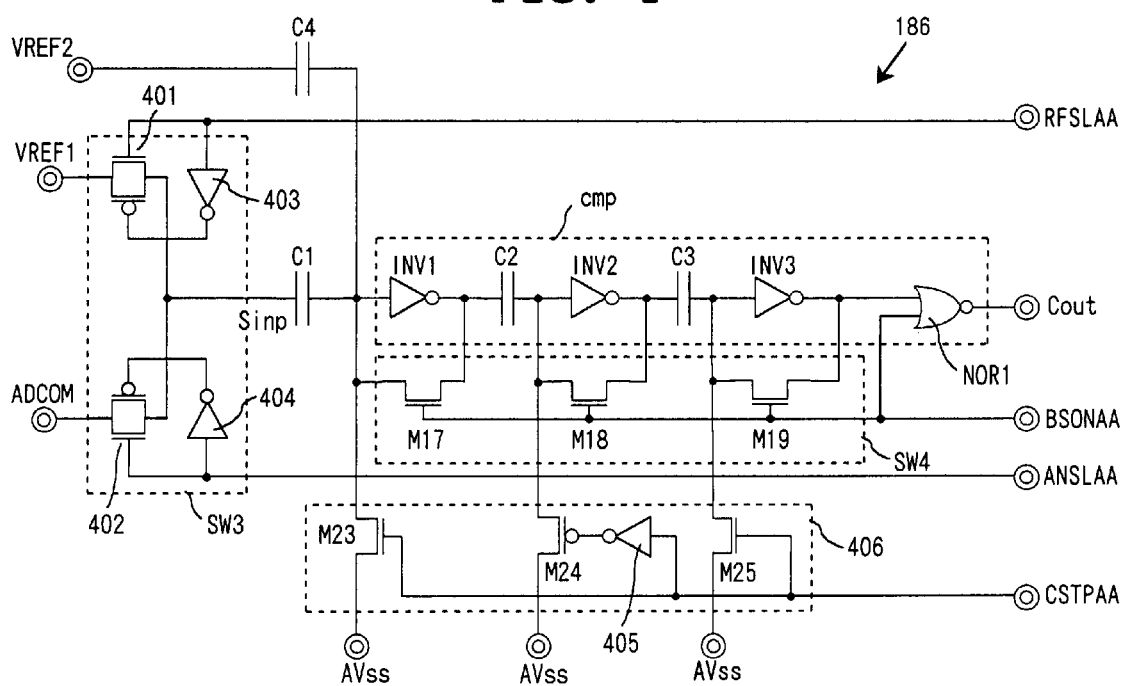
FIG. 4 is a circuit diagram showing an example of the configuration of a comparator circuit included in the A/D converter.

Now, details of the comparator circuit 186 will be described. FIG. 4 shows an example of the configuration of the comparator circuit 186. The comparator circuit 186 shown in FIG. 4 is not particularly limited, but it is of a chopper type, which includes sampling capacitors C1 and C4, a selector SW3, a comparing part CMP, a switch circuit SW4 and a controller circuit 406.

The selector SW3 selectively transfers the reference voltage VREF1 transmitted through the operational amplifier OP1 and an analog signal ADCOM transmitted through the analog multiplexer 185 to the sampling capacitor C1 according to a control signal RFSLAA. The selector SW3 includes transfer switches 401 and 402, each composed of a p-channel MOS transistor and an n-channel MOS transistor connected in parallel, and inverters 403 and 404 for respectively actuating the transfer switches 401 and 402.

The reference voltage VREF2 transmitted through the operational amplifier OP2 is transferred to the sampling capacitor C4. The other ends of the sampling capacitors C1, C4 are coupled to an input terminal of the comparing part CMP. The comparing part CMP compares the input analog signal ADCOM with the reference voltages VREF1, VREF2 through the sampling capacitors C1, C2. The comparing part CMP is not particularly limited, but it includes inverters INV1, INV2 and INV 3, capacitors C2 and C3, and a NOR gate NOR1. In the comparing part CMP, an output signal of the inverter INV1 is transmitted to the inverter INV2 of the subsequent stage through the capacitor C2; an output signal of the inverter INV2 is transmitted to the subsequent stage inverter INV3 through the capacitor C3; and an output signal of the inverter INV3 is transmitted to one input terminal of the NOR gate NOR1 placed in the subsequent stage. To the other input terminal of the NOR gate NOR1 is transmitted a control signal BSONAA. In the case where the control signal BSONAA is in its low level, the result of the comparison is output from the NOR gate NOR1. In the case where the control signal BSONAA is in its high level, the output terminal of the NOR gate NOR1 is fixed at its low level.

The switch circuit SW4 includes: an n-channel MOS transistor M17 capable of short-circuiting between the input and output terminals of the inverter INV1; an n-channel MOS transistor M18 capable of short-circuiting between the input and output terminals of the inverter INV2; and an n-channel MOS transistor M19 capable of short-circuiting between the input and output terminals of the inverter INV3. The MOS transistors M17, M18 and M19 are controlled in operation by the control signal BSONAA.

The controller circuit 406 has the function of controlling the operation of the comparing part CMP based on a control signal CSTPAA. The controller circuit 406 includes: an n-channel MOS transistor M23 capable of coupling the input terminal of the inverter INV1 to the low-potential-side power source AVss; a p-channel MOS transistor M24 capable of coupling the input terminal of the inverter INV2 to the low-potential-side power source AVss; an n-channel MOS transistor M25 capable of coupling the input terminal of the inverter INV3 to the low-potential-side power source AVss; and an inverter 405 for driving the p-channel MOS transistor M24. The control signal CSTPAA is transmitted to the gate electrodes of the n-channel MOS transistors M23 and M25. Also, the control signal CSTPAA is transmitted to the gate electrode of the p-channel MOS transistor M24 through the inverter 405.

In the comparator circuit 186 arranged as described above, when the control signal ANSLAA is changed to its high level during a sampling period, the transfer switch 402 is brought into conduction; and when the control signal BSONAA is changed to its high level during a sampling period, the MOS transistors M17, M18 and M19 are brought into conduction. Thus, the input and output of the comparator circuit 186 are set near the logical threshold values of the inverters INV1–INV3. Thereafter, when the control signal ANSLAA is changed to its low level, the transfer switch 401 is brought into conduction; when the control signal BSONAA is changed to its low level, the MOS transistors M17, M18 and M19 are brought out of conduction. In this condition, the reference voltages VREF1 and VREF2 supplied from the local D/A converter 181 are used to execute the judgment of an input analog signal voltage (successive comparisons).

The control signals RFSLAA, BSONAA, ANSLAA and CSTPAA are supplied from the control circuit 187 shown in FIG. 1.

Figure 5:
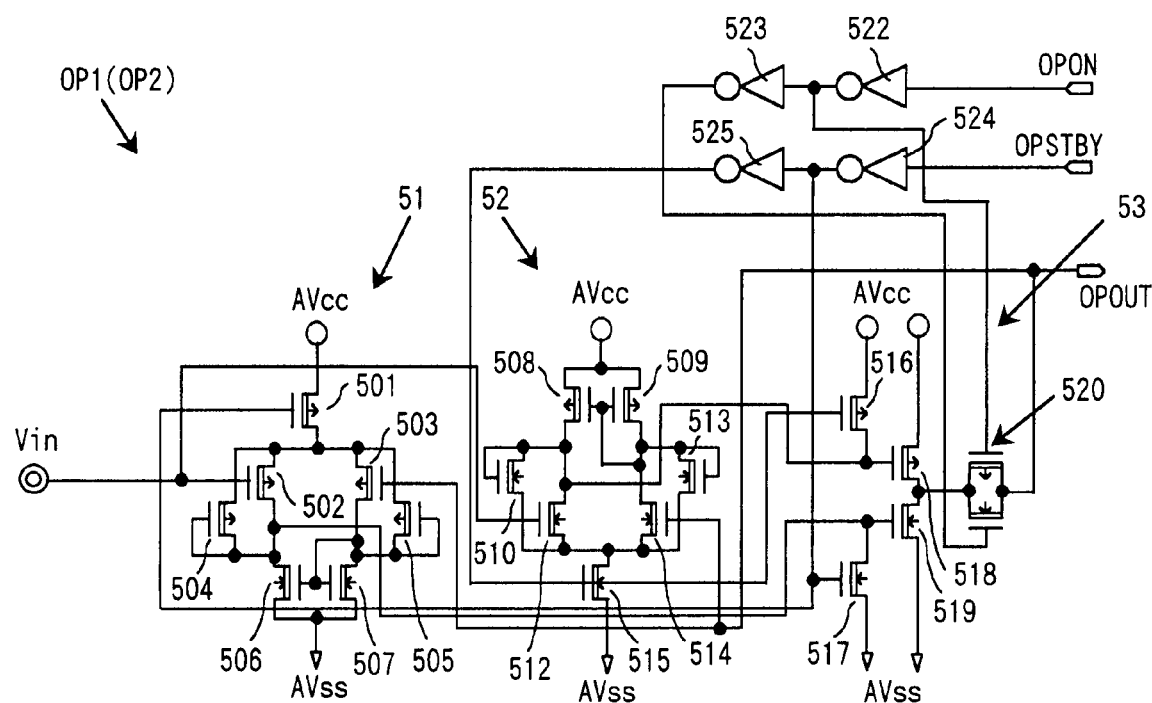
FIG. 5 is a circuit diagram showing an example of the configuration of an operational amplifier included in the A/D converter.

Turning now to FIG. 5, there is shown an example of the configuration of the operational amplifier OP1. The operational amplifiers OP1 and OP2 are the same in configuration, and therefore details of the operational amplifier OP1 will be described here. The configuration shown in FIG. 5 is of rail-to-rail type. Operational amplifiers of the rail-to-rail type have an input voltage range widened to positive and negative source voltage ranges and as such, they can prevent their input voltage ranges from being narrowed even when the voltage level of the high-potential-side power source AVcc is relatively low. On this account, a rail-to-rail type operational amplifier is a suitable circuit in the case where the output voltage changes over a wide range as in the ladder-type resistor 182.

The operational amplifier OP1 shown in FIG. 5 is not particularly limited, but it includes a first differential part 51, a second differential part 52, an output part 53 and inverters 522–525. An input voltage from the input terminal Vin is amplified in both the first differential part 51 and the second differential part 52 and transmitted to the output part 53 in the subsequent stage.

The first differential part 51 includes p-channel MOS transistors 501, 502, 503, 504 and 505, and n-channel MOS transistors 506 and 507. The p-channel MOS transistors 502 and 503 each have a source electrode coupled to the high-potential-side power source AVcc through the p-channel MOS transistor 501, thereby to form a differential pair. The n-channel MOS transistors 506 and 507 form a current mirror-type load with respect to the differential pair. An input voltage from the input terminal Vin is transmitted to the gate electrode of the p-channel MOS transistor 502. The output signal of the operational amplifier OP1 is fed back to the gate electrode of the p-channel MOS transistor 503. The p-channel MOS transistor 501 is a constant current source for determining an amount of current flowing through the first differential part 51.

The second differential part 52 includes p-channel MOS transistors 508 and 509, and n-channel MOS transistors 510, 512, 513, 514 and 515. The n-channel MOS transistors 512 and 514 each have a source electrode coupled to the low-potential-side power source AVss through the n-channel MOS transistor 515, thereby to form a differential pair. The p-channel MOS transistors 508 and 509 form a current mirror-type load with respect to the differential pair. An input voltage from the input terminal Vin is transmitted to the gate electrode of the n-channel MOS transistor 512. The output signal of the operational amplifier OP1 is also fed back to the gate electrode of the n-channel MOS transistor 514. The n-channel MOS transistor 515 is a constant current source for determining an amount of current flowing through the second differential part 52.

The output part 53 includes p-channel MOS transistors 516 and 518, n-channel MOS transistors 517 and 519, and a transfer switch 520. The transfer switch is composed of a p-channel MOS transistor and an n-channel MOS transistor connected in parallel. The p-channel MOS transistor 518 and the n-channel MOS transistor 519 are connected in series. The p-channel MOS transistor 518 has a source electrode coupled to the high-potential-side power source AVcc. The n-channel MOS transistor 519 has a source electrode coupled to the low-potential-side power source AVss. Further, the n-channel MOS transistor 517 has a gate electrode to which the output signal of the first differential part 51 is transmitted; and the p-channel MOS transistor 518 has a gate electrode to which the output signal of the second differential part 52 is transmitted. The node between the p-channel MOS transistor 518 and the n-channel MOS transistor 519 connected in series is coupled to the output terminal OPOUT through the transfer switch 520 in the subsequent stage. The p-channel MOS transistor 516 and the n-channel MOS transistor 517 are provided to respectively select the output of the second differential pair or AVcc and the output of the first differential pair or AVss according to a signal from POSTBY.

An output control signal OPON is transmitted to the transfer switch 520 through the inverters 522, 523. When the output control signal OPON is changed to its high level by the control circuit 187, the transfer switch 520 is brought into conduction. Thus, an output signal from the node between the p-channel MOS transistor 518 and the n-channel MOS transistor 519 connected in series is transmitted to the output terminal OPOUT through the transfer switch 520. In contrast, when the output control signal OPON is changed to its low level by the control circuit 187, the transfer switch 520 is brought out of conduction and therefore the output terminal OPOUT is brought to a high impedance condition.

A standby control signal OPSTBY is transmitted to the gate electrodes of the n-channel MOS transistor 517 and the p-channel MOS transistor 501 through the inverter 524 and further transmitted to the gate electrodes of the n-channel MOS transistor 515 and the p-channel MOS transistor 516 through the inverter 525. When the standby control signal OPSTBY is brought to its high level by the control circuit 187, the p-channel MOS transistor 501 and the n-channel MOS transistor 515 are turned on and the p-channel MOS transistor 516 and the n-channel MOS transistor 517 are turned off. As a result, the operational amplifier OP1 is brought into operation. In contrast, when the standby control signal OPSTBY is brought to its low level by the control circuit 187, the p-channel MOS transistor 501 and the n-channel MOS transistor 515 are turned off, and the p-channel MOS transistor 516 and the n-channel MOS transistor 517 are turned on. As a result, the operational amplifier OP1 is brought to its standby condition. In general, when an operational amplifier starts to work from its standby condition, it takes a lot of time before the bias voltage level of each part is stabilized. Therefore, in this embodiment, the standby control signal OPSTBY is held at its high level to keep the operational amplifiers OP1, OP2 in operation during conversion, whereby the operational amplifiers can take an amplifying action rapidly. In order to avoid unwanted voltage transmission to the comparator circuit 186 during this time, the output terminal OPOUT of the operational amplifier is brought to a high impedance condition by the output control signal OPON.

Figure 6:
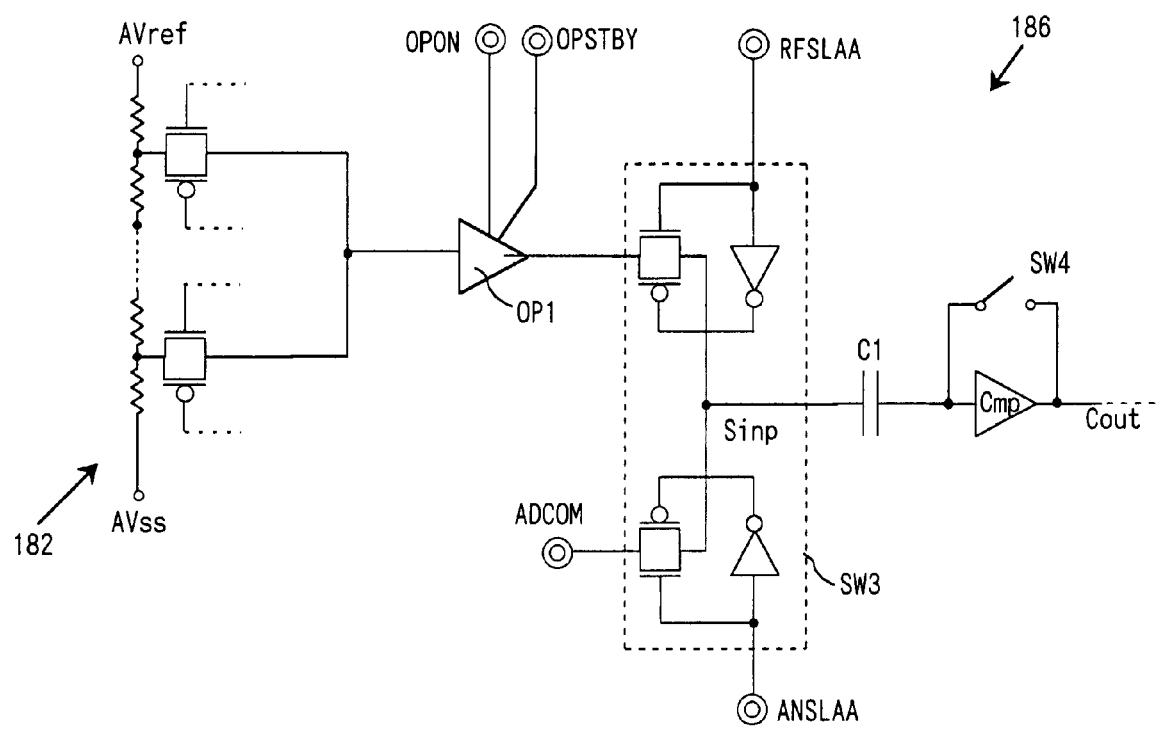
FIG. 6 is a circuit diagram of assistance in explaining the operations of a main part in the A/D converter.

This embodiment makes it possible to reduce a current output from the ladder-type resistor 182 by providing the operational amplifiers OP1, OP2 between the ladder-type resistor 182 and the comparator circuit 186 and supplying an output voltage of the ladder-type resistor 182 to the comparator circuit 186 through the operational amplifiers OP1, OP2, as shown in FIG. 6. Also, it is possible to achieve a higher A/D conversion speed because charge and discharge of the sampling capacitors C1, C4 can be carried out at high speeds by the operational amplifiers OP1 and OP2 with low output impedances. In addition, rail-to-rail type operational amplifiers are adopted as the operational amplifiers OP1, OP2 and as such, their output amplitudes can be caused to fluctuate almost up to the source voltage levels. This makes it possible to transmit the reference voltages produced by the ladder-type resistor 182 to the comparator circuit 186 with high precision even when the source voltage is relatively low.

Figure 7:
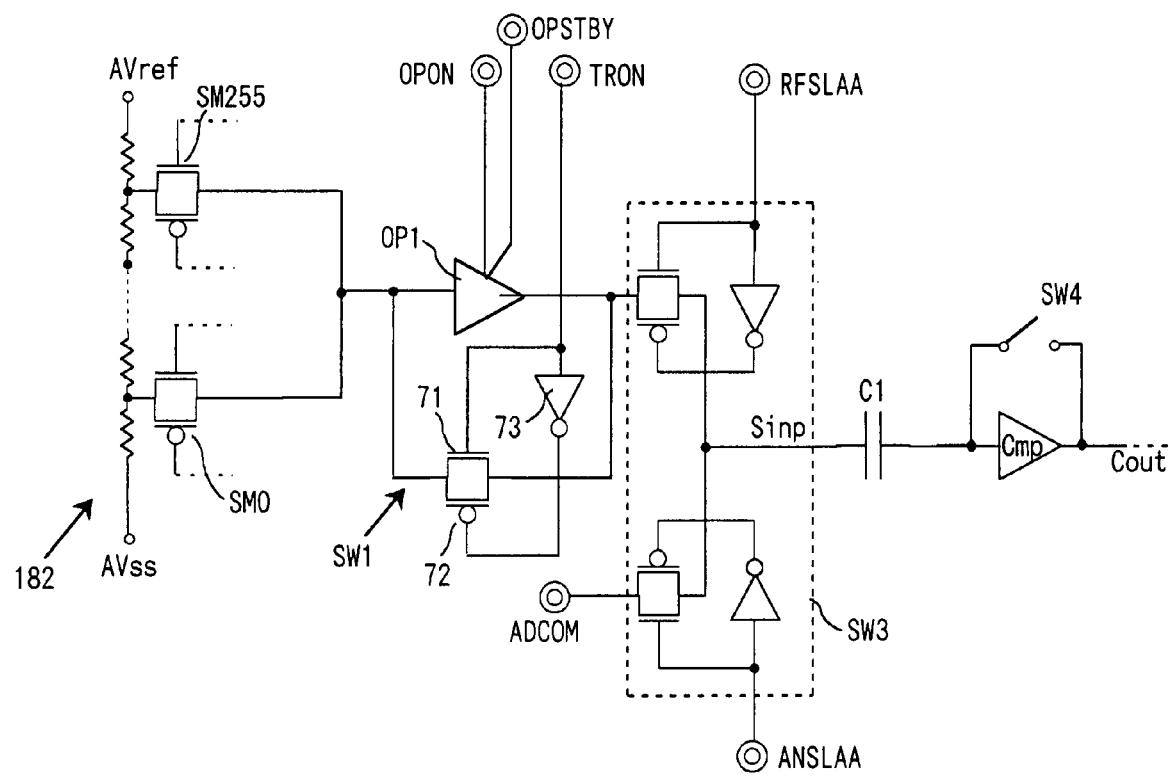
FIG. 7 is a circuit diagram of assistance in explaining the operations of a main part in the A/D converter.
Figure 15:
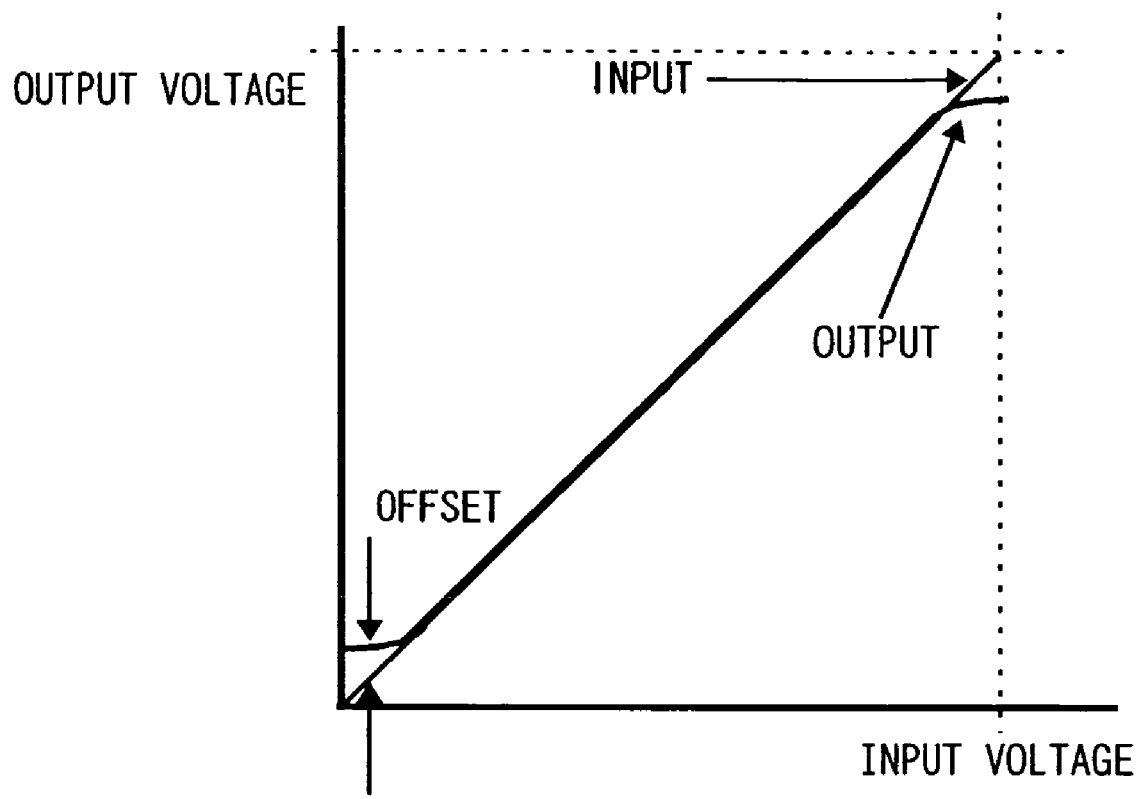
FIG. 15 is a view showing input and output characteristics of the operational amplifier included in the A/D converter.

As is clear from the input and output characteristics shown in FIG. 15, the operational amplifiers OP1, OP2 each exhibit an offset. However, the offset can be corrected by connecting the transfer switches SW1, SW2 for offset correction respectively in parallel with the operational amplifiers OP1, OP2 and as such, the reduction in the precision of A/D conversion can be prevented. For example, the transfer switch SW1 for offset correction may be arranged by connecting an n-channel MOS transistor 71 and a p-channel MOS transistor 72 in parallel as shown in FIG. 7. A control signal TRON output from the control circuit 187 is transmitted to the gate electrode of the n-channel MOS transistor 71 and also to the gate electrode of the p-channel MOS transistor 72 through the inverter 73. When the control signal TRON is brought to its high level by the control circuit 187, the MOS transistors 71, 72 are turned on concurrently to short-circuit between the input and output terminals of the operational amplifier OP1. As a result, the offset of the operational amplifier OP1 is corrected.

Figure 12:
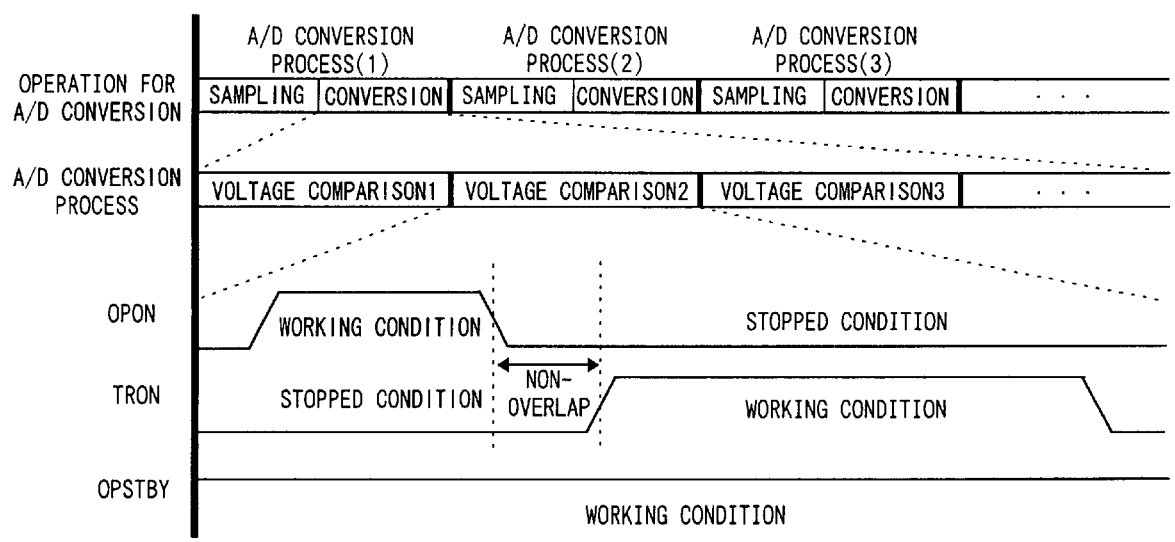
FIG. 12 is an illustration of assistance in explaining the operations of the A/D converter.

Turning now to FIG. 12, there is shown the relation between A/D conversion actions and offset correction.

The A/D conversion process is repeatedly carried out as indicated by (1) to (3). Each A/D conversion process includes a sampling step and a conversion processing step. In the conversion-processing step, a reference voltage is successively changed in its level and a comparison with respect to the voltage is made each time the level is changed. In such voltage comparison, the operational amplifiers OP1, OP2 are brought to a continuously working condition by making the standby control signal POSTBY high level. The control signals OPON and TRON are in a non-overlapping relation. Making the control signal OPON its high level brings the operational amplifier OP1 into operation, while the control signal TRON is made its low level and therefore no the offset correction is made. After the control signal OPON is made its low level and the output terminal of the operational amplifier OP1 is brought to a high impedance condition, the control signal TRON is made its high level to bring the transfer switch SW1 into conduction, whereby the offset correction is made. Further, in a sampling step, the POSTBY is controlled so as to turn the p-channel MOS transistor 501 off, the n-channel MOS transistor 515 off, the p-channel MOS transistor 516 on, and the n-channel MOS transistor 517 on, which makes it possible to cut down electric current consumption in the first and second differential parts and a circuit configured of the p-channel MOS transistor 518 and the n-channel MOS transistor 519 connected in series between AVcc and AVss during a period of the sampling step. Also, in a conversion processing step, the POSTBY is controlled so as to turn the p-channel MOS transistor 501 on, the n-channel MOS transistor 515 on, the p-channel MOS transistor 516 off, and the n-channel MOS transistor 517 off, whereby the first and second differential parts and the circuit configured of the p-channel MOS transistor 518 and the n-channel MOS transistor 519 connected in series between AVcc and AVss can be made operable and A/D conversion can be sped up with the electric current consumption cut down during a period of the conversion processing step.

Figure 16:
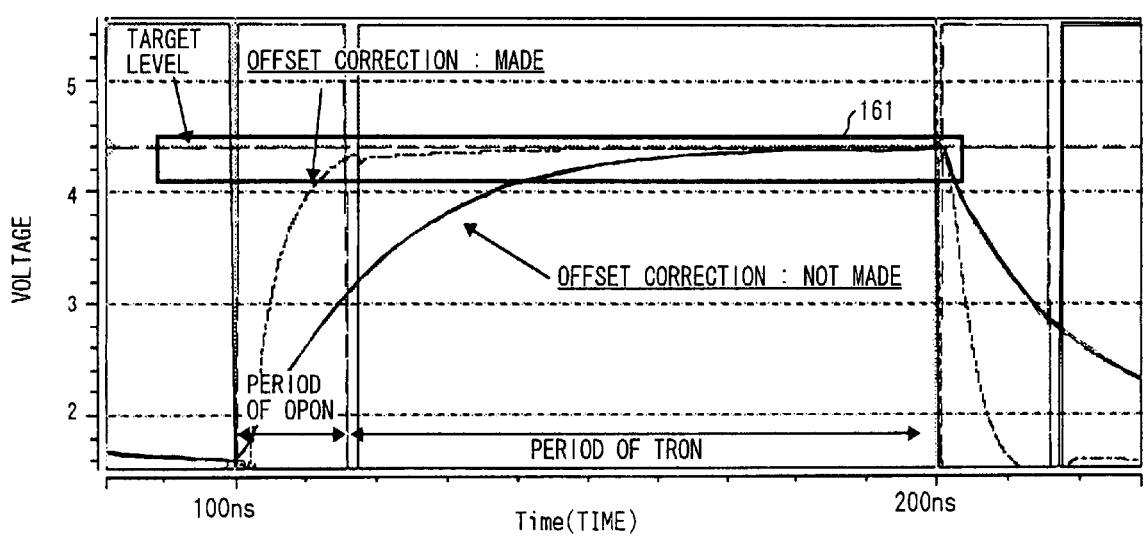
FIG. 16 is a plot of characteristic curve showing results of the simulation concerning offset correction with respect to the operational amplifier included in the A/D converter.
Figure 17:
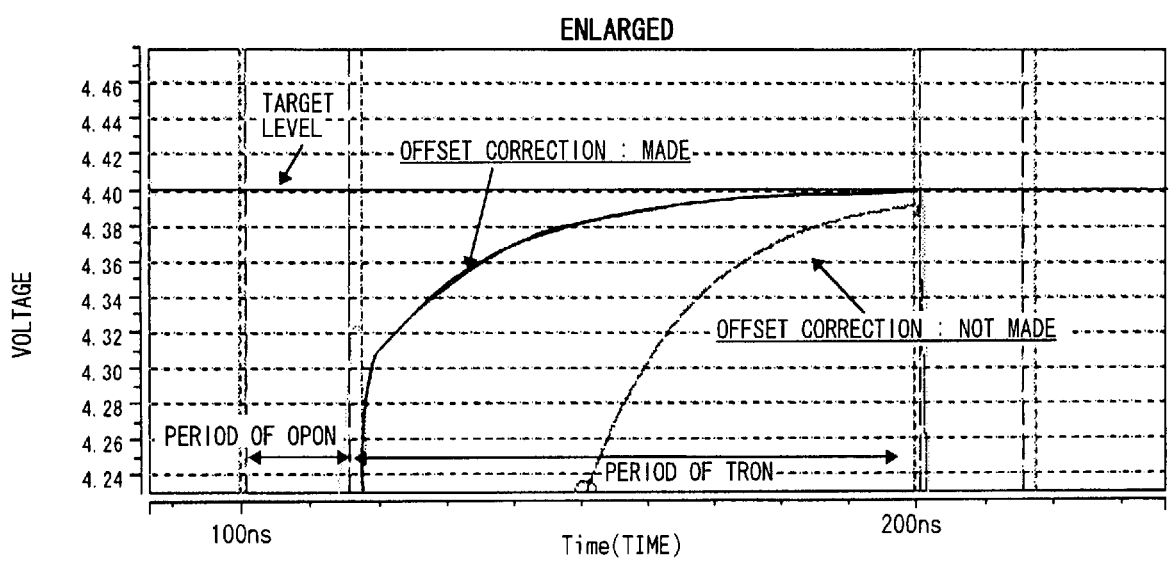
FIG. 17 is an enlarged plot of characteristic curve showing a principal portion of FIG. 16 under magnification.

Referring to FIG. 16, there are shown the results of simulation on the offset correction. The principal portion 161 in FIG. 16 is shown under magnification in FIG. 17.

It is found that it takes a shorter time before a voltage reaches a target level (e.g., 4.4 volts) when the offset correction is made, in comparison to when the offset correction is not made. Therefore, the offset conversion is useful for speeding up A/D conversions.

Figure 8:
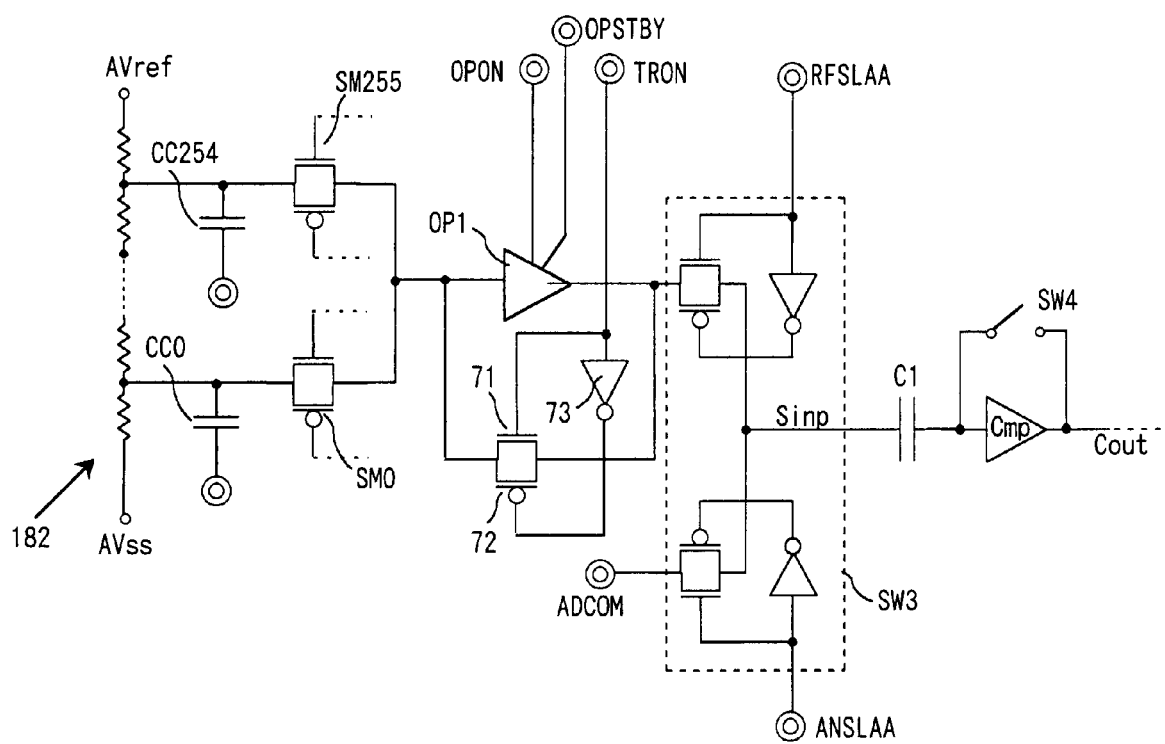
FIG. 8 is a circuit diagram of assistance in explaining the operations of a main part in the A/D converter.

The operational amplifiers OP1, OP2 are provided and thus it becomes possible to charge and discharge the sampling capacitors C1, C4 at high speeds with the operational amplifiers OP1, OP2 with low output impedances. Therefore, the speed-up of the A/D conversion speed can be achieved by shortening the sampling time. However, in the case where the transfer switch SW1 is brought into conduction to carry out the charge and discharge, the output impedance of the ladder-type resistor 182 comes into sight electrically and as such, the charge and discharge are delayed by an amount of the offset of the operational amplifier OP1. Then, in order to carry out the charge and discharge corresponding to the amount of the offset of the operational amplifier OP1 at high speeds, the capacitors CC0–CC255 are provided between the low-potential-side power source AVss and nodes of the resistors R0–R256 connected in series in the ladder-type resistor 182, as shown in FIG. 8, thereby to keep a voltage level at each node (see FIG. 1). Thus, the charge and discharge in the offset correction are sped up by charge sharing of corresponding one of the capacitors CC0–CC255 when the transfer switch SW1 is brought into conduction to carry out the charge and discharge.

Here, the reason why the control signals OPON and TRON are kept from overlapping each other is as follows.

Figure 14:
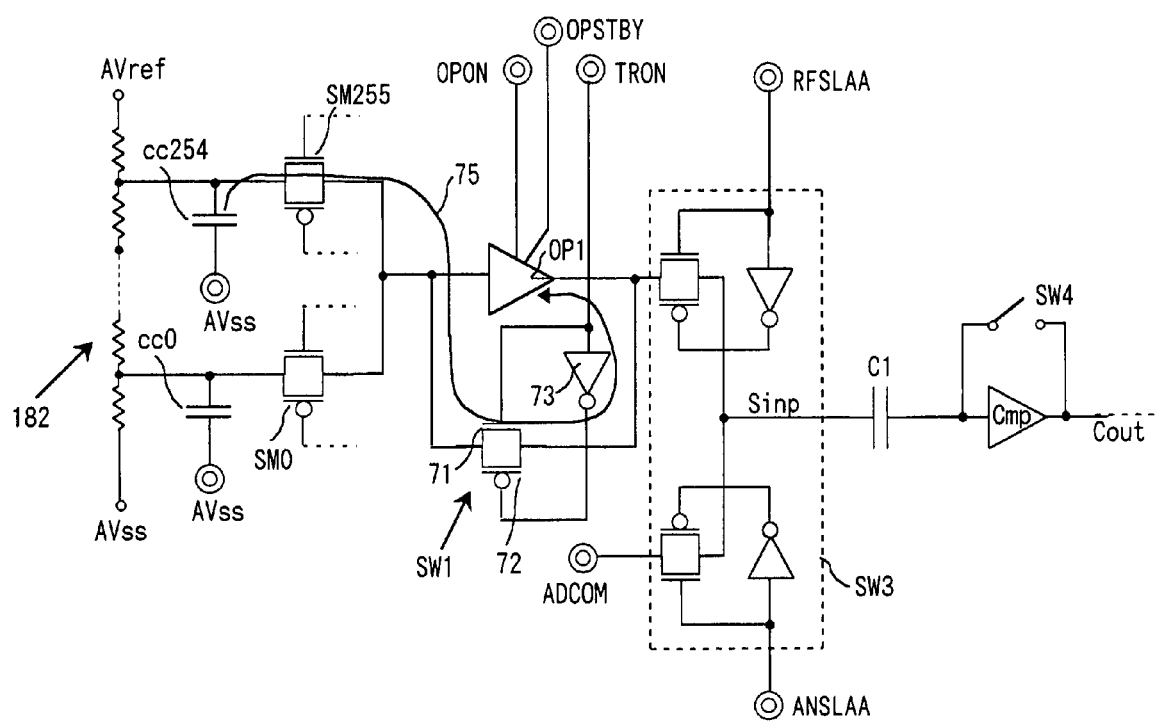
FIG. 14 is a circuit diagram of assistance in explaining the reason why an undesirable current flows in the A/D converter.

When the control signals OPON and TRON overlap each other, the transfer switch SW5 is to be brought into conduction during a period over which the output terminal of the operational amplifier OP1 isn't in a high impedance condition. In the case, depending on the output logic of the operational amplifier OP1, a current 75 can flow into the output terminal of the operational amplifier OP1 through the transfer switch SW1 from the ladder-type resistor 182 as shown in FIG. 14 to cancel out an electric charge accumulated in the capacitor CC254 and thus the significance of existence of the capacitor CC254 can be lost. Then, the control signals OPON and TRON are kept from overlapping each other, thereby to prevent the current 75 from flowing into the output terminal of the operational amplifier OP1 through the transfer switch SW1 and to avoid an undesirable condition as described above.

Also, the operational amplifier OP2 and the transfer switch SW2 connected in parallel with it bring about like effects and advantages.

According to the above embodiments, the following effects and advantages can be obtained.

Figure 9:
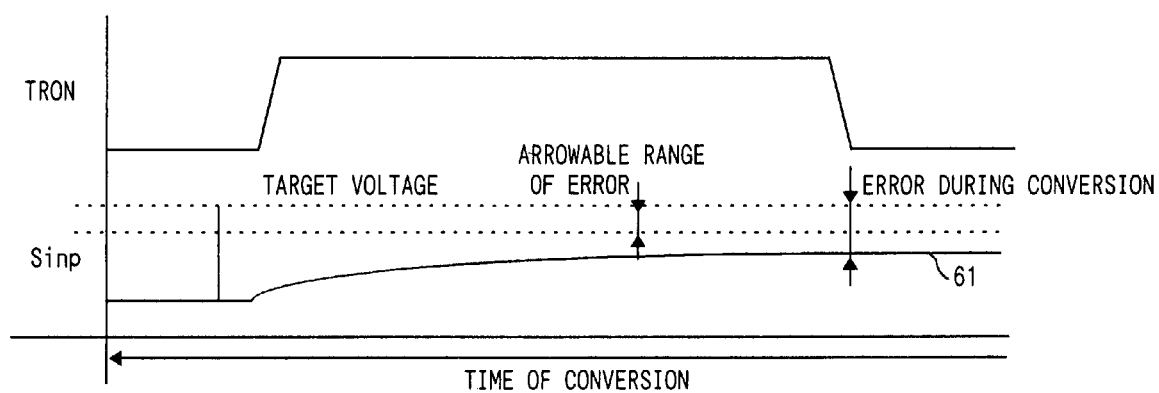
FIG. 9 is an operation timing chart of a circuit used for comparison with the A/D converter.
Figure 10:
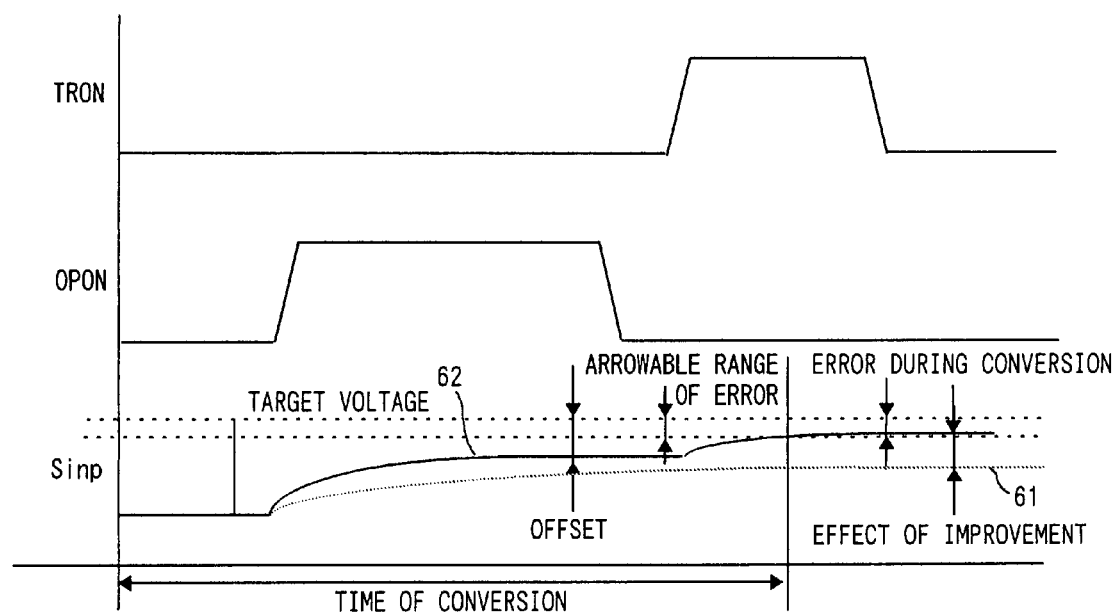
FIG. 10 is a timing chart of assistance in explaining the actions of the main part in the A/D converter.

(1) In the case where the operational amplifiers OP1, OP2 and transfer switches SW1, SW2 are not interposed between the ladder-type resistor 182 and the comparator circuit 186, the time that elapses before the charged voltage of each of the sampling capacitors C1, C4 reaches a target value is relatively longer, as indicated by a sampling capacitor charging time characteristic curve 61 in FIG. 9 and the error in the conversion is comparatively large. In contrast, in the case where the operational amplifiers OP1, OP2 and the transfer switches SW1, SW2 are interposed between the ladder-type resistor 182 and the comparator circuit 186, the current output from the ladder-type resistor 182 can be reduced and the operational amplifiers OP1, OP2 with low output impedances allow the sampling capacitors C1, C4 to be charged and discharged at high speeds. Further, the offsets of the operational amplifiers are corrected by the transfer switches SW1, SW2, whereby the time that elapses before the charged voltage of each of the sampling capacitors C1, C4 reaches a target voltage is shortened, as indicated by a sampling capacitor charging time characteristic curve 62 in FIG. 10, in comparison to the sampling capacitor charging time characteristic curve 61, and the effects that the sampling capacitor charging time characteristics are improved by the operational amplifiers OP1, OP2 and the transfer switches SW1, SW2 can be obtained.

(2) When the control signals OPON and TRON overlap each other, the transfer switch SW5 is to be brought into conduction during a period over which the output terminal of the operational amplifier OP1 isn't in a high impedance condition. In the case, depending on the output logic of the operational amplifier OP1, a current 75 can flow into the output terminal of the operational amplifier OP1 through the transfer switch SW1 from the ladder-type resistor 182 as shown in FIG. 14 to cancel out an electric charge accumulated in the capacitor CC254 and thus the significance of existence of the capacitor CC254 can be lost. On the contrary, in this embodiment, the control signals OPON and TRON are kept from overlapping each other, thereby to make possible to prevent the current 75 from flowing into the output terminal of the operational amplifier OP1 through the transfer switch SW1 and to avoid an undesirable condition as described above.

Figure 11:
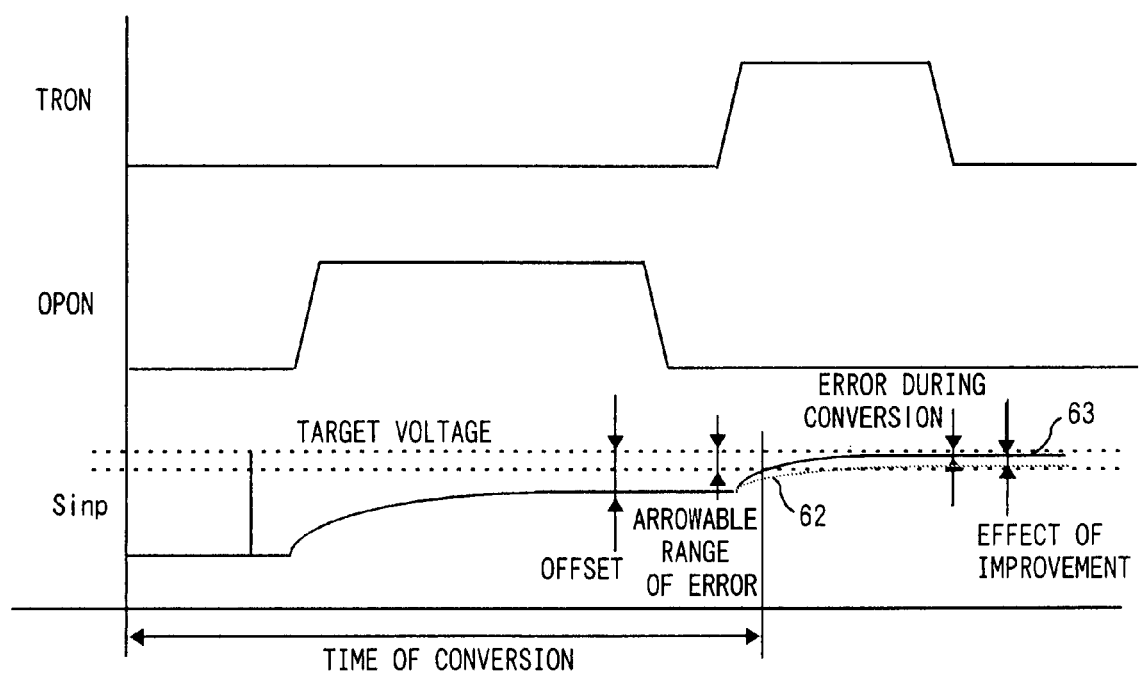
FIG. 11 is a timing chart of assistance in explaining the actions of the main part in the A/D converter.

(3) In the case where the transfer switch SW1 is brought into conduction to carry out the charge and discharge, the output impedance of the ladder-type resistor 182 comes into sight electrically and as such, the charge and discharge are delayed by an amount of the offset of the operational amplifier OP1. On the contrary, in this embodiment, in order to carry out the charge and discharge corresponding to the amount of the offset of the operational amplifier OP1 at high speeds, the capacitors CC0–CC255 are provided between the low-potential-side power source AVss and nodes of the resistors R0–R256 connected in series in the ladder-type resistor 182, as shown FIG. 8, thereby to keep a voltage level at each node. This can ensure that the charge and discharge in the offset correction are sped up by charge sharing of corresponding one of the capacitors CC0–CC255 when the transfer switch SW1 is brought into conduction to carry out the charge and discharge. Thus, the time that elapses before the charged voltage of each of the sampling capacitors C1, C4 reaches a target voltage is further shortened, as indicated by a sampling capacitor charging time characteristic curve 63 in FIG. 11, in comparison to the sampling capacitor charging time characteristic curve 62, and the effects that the sampling capacitor charging time characteristics are improved by charge sharing of the capacitors CC0–CC255 can be obtained.

(4) When the operational amplifiers OP1, OP2 start to work from their standby conditions, they take a lot of time before the bias voltage level of each part is stabilized. Therefore, the standby control signal OPSTBY is held at its high level to keep the operational amplifiers OP1, OP2 in operation during conversion, whereby the operational amplifiers can take an amplifying action rapidly. In order to avoid unwanted voltage transmission to the comparator circuit 186 during this time, the output terminals of operational amplifiers OP1, OP2 are brought to their high impedance conditions by output control signals.

(5) Rail-to-rail type operational amplifiers are adopted as the operational amplifiers OP1, OP2 and as such, their output amplitudes can be caused to fluctuate almost up to the source voltage levels. This makes it possible to transmit the reference voltages produced by the ladder-type resistor 182 to the comparator circuit 186 with high precision even when the source voltage is relatively low.

Figure 18:
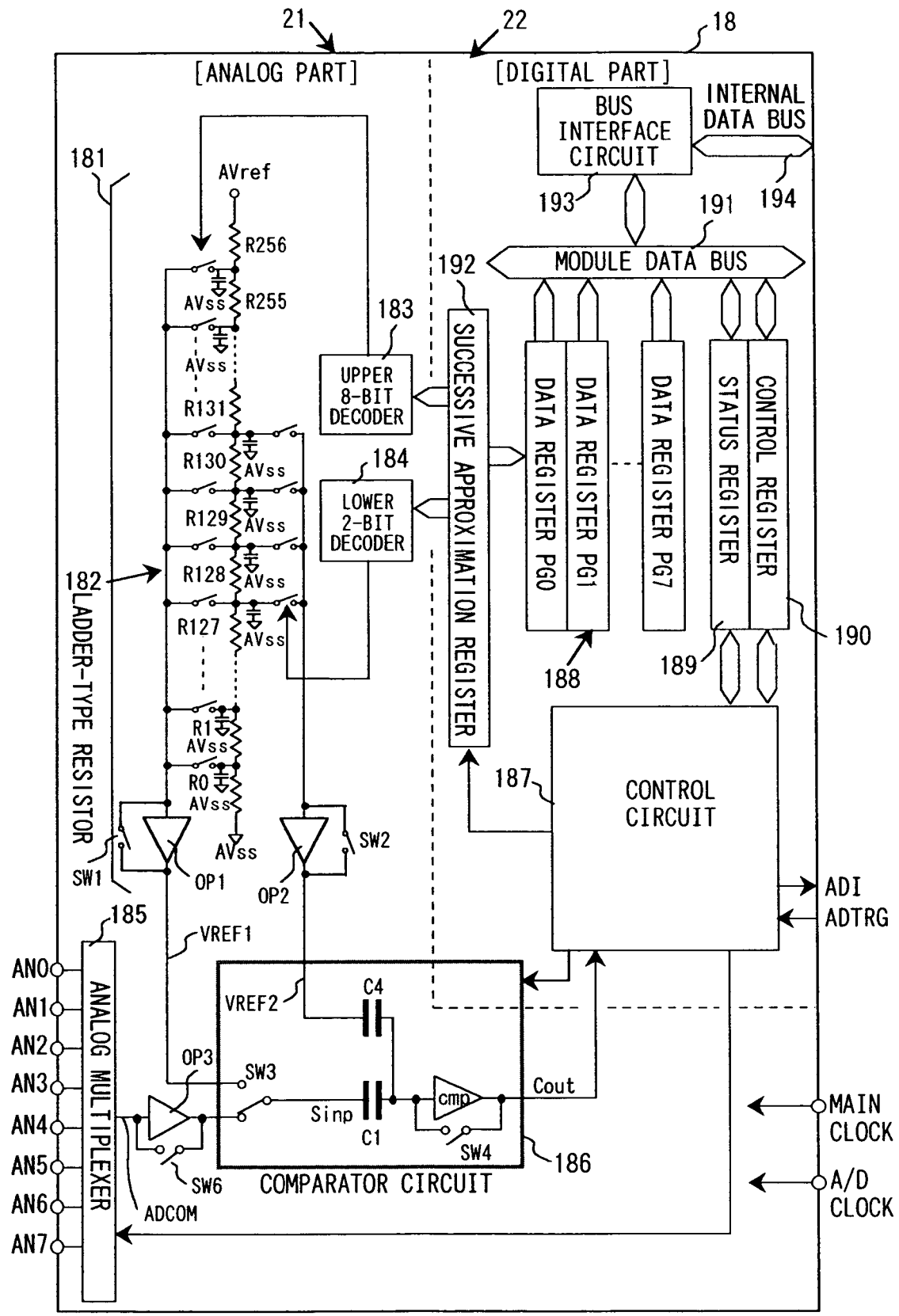
FIG. 18 is a circuit diagram showing another example of the configuration of the A/D converter.

Turning now to FIG. 18, there is shown another example of the configuration of the A/D converter 18.

The A/D converter 18 shown in FIG. 18 is different from that shown in FIG. 1 in having an operational amplifier OP3 and a transfer switch SW6 connected in parallel with the operational amplifier OP3, both provided between the analog multiplexer 185 and the comparator circuit 186. The operational amplifier OP3 and the transfer switch SW6 are the same in concrete configuration and operation control as the operational amplifier OP1 and transfer switch SW1 in FIG. 1 respectively. Therefore, detailed descriptions for them are omitted here.

For example, in the case where the microcomputer 20 is applied to a system which functions in an adverse environment high in external noise like a control system of a motor vehicle, possible means in order to make a signal-to-noise ratio of a sensor used as an analog signal source better are: placing a series resistor (of tens to hundreds of thousands of ohms) between analog input terminals of the A/D converter and the sensor to use the series resistor as a filter circuit; and using a sensor circuit having an impedance of tens to hundreds of thousands of ohms as an entire analog signal source. In such cases, the operational amplifier OP3 and the transfer switch SW6 connected in parallel with the operational amplifier OP3 are provided between the analog multiplexer 185 and the comparator circuit 186 as shown in FIG. 18, whereby the current output from the analog signal source can be reduced and the sampling capacitor C1 can be driven at a high speed by the output of the operational amplifier OP3. As a result, the A/D conversion can be sped up. In addition, the transfer switch SW6 is used to carry out the offset correction of the operational amplifier, whereby the precision of sampling analog signals can be improved. Further, non-overlap signals are used for controlling the operations of the operational amplifier OP3 and the transfer switch SW6 connected in parallel with the operational amplifier OP3, which makes possible to avoid an undesirable current flowing into the output terminal of the operational amplifier OP3 through the transfer switch SW6. Moreover, a rail-to-rail type operational amplifier is adopted as the operational amplifier OP3, which enables the output voltage of the operational amplifier OP3 to fluctuate almost up to the source voltage level.

Figure 19:
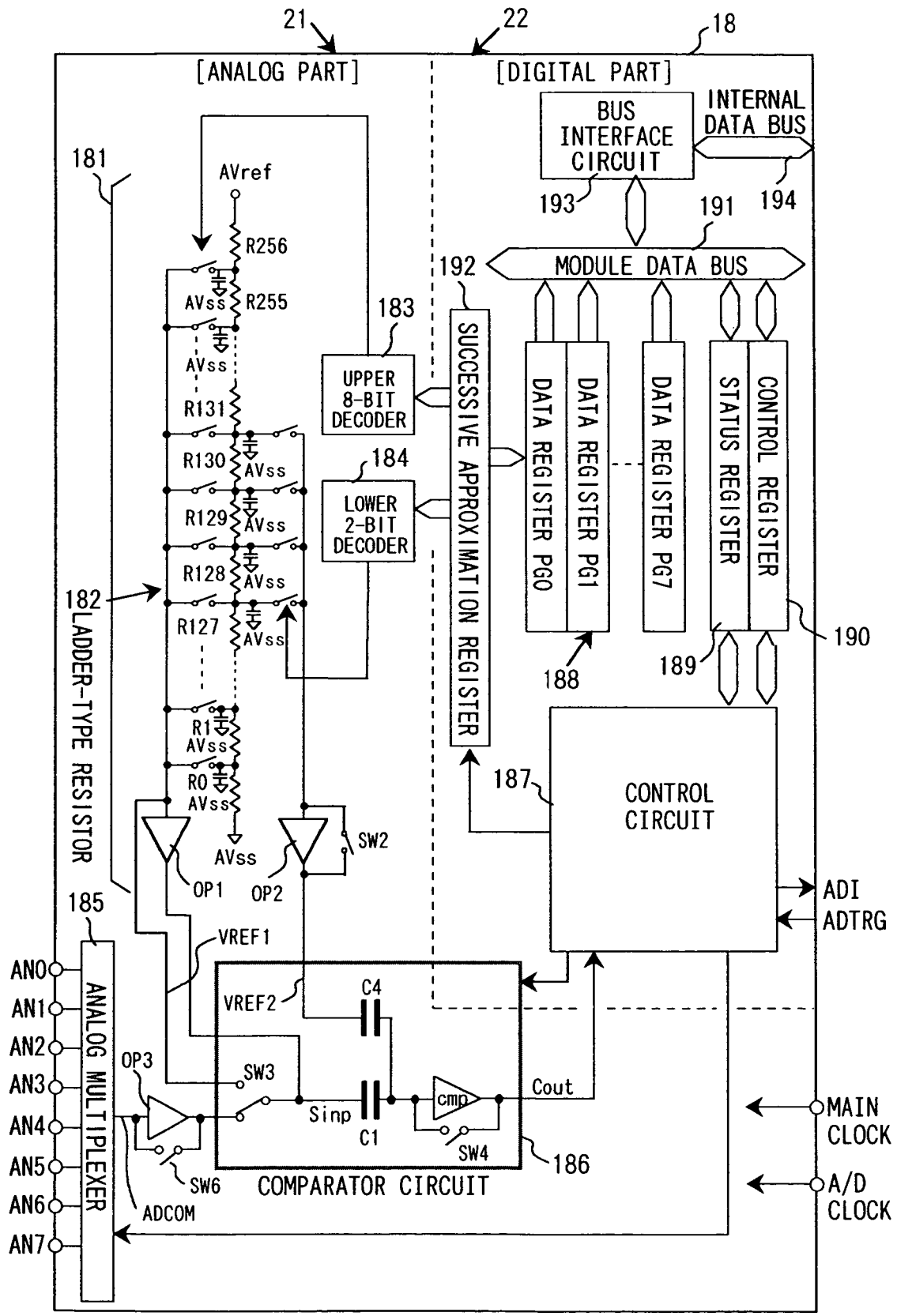
FIG. 19 is a circuit diagram showing still another example of the configuration of the A/D converter.

Still another example of the configuration of the A/D converter 18 is shown in FIG. 19.

The A/D converter 18 shown in FIG. 19 is extremely different from that shown in FIG. 19 in that the output terminal of the operational amplifier OP1 is directly connected to the sampling capacitor C1. The operational amplifier OP1 incorporates a transfer switch 520, which can be controlled in its operation by a control signal OPON. Thus, it becomes possible to bring the output terminal of the operational amplifier to its high impedance condition. This allows the output terminal of the operational amplifier OP1 to be directly coupled to the sampling capacitor C1 without interposing the selector SW3 therebetween. In this case, the impedance of the selector SW3 is irrelevant to the driving of the sampling capacitor C1 by the operational amplifier OP1 and as such, the capacitance value of the capacitors CC0–CC254 can be made smaller accordingly. Also, the transfer switch SW1 can be eliminated because the selector SW3 can provide the function for offset correction, which is necessary for the A/D converters shown in FIGS. 1 and 18.

Although the invention, which was made by the inventor, has been concretely described above, it is not so limited. It is needless to say that various modifications may be made without departing from the subject matter of the invention.

Figure 20:
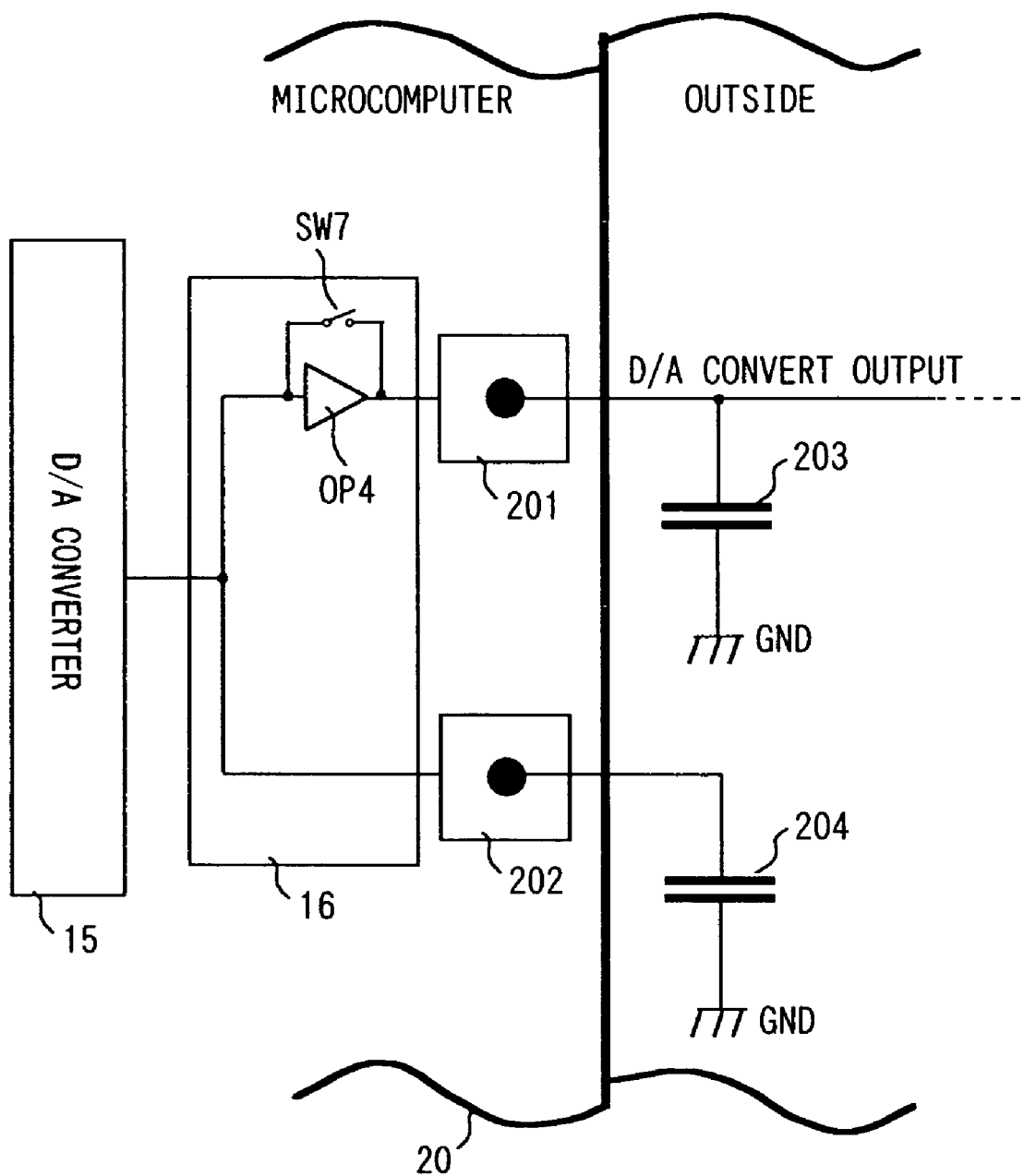
FIG. 20 is a circuit diagram showing an example of the configuration of a main part of the microcomputer.

For example, as shown in FIG. 20, the D/A output part 16 placed in the subsequent stage of the D/A converter 15 may be provided with an operational amplifier OP4 and a transfer switch SW7 connected in parallel with the operational amplifier OP4. An output signal of the operational amplifier OP4 is output through a pad 201 to the outside. The operational amplifier OP4 drives an external load with an output impedance smaller than that of the D/A converter 15. Therefore, the operational amplifier OP4 enables the charge and discharge of a load capacitance 203 at higher speed in comparison to when the output signal of the D/A converter 15 is directly output to the outside. Incidentally, the operational amplifier OP4 and the transfer switch SW7 are the same in concrete configuration and operation control as the operational amplifier OP1 and transfer switch SW1 in FIG. 1 respectively. Further, in the charge and discharge corresponding an amount of the offset of the operational amplifier OP4 with the transfer switch SW7 in its on state, the influence of the output impedance of the D/A converter 15 appears in the output because of the high output impedance of the D/A converter 15. To cope with this, a capacitance (capacitor) 204 is provided in parallel with the operational amplifier OP4 inside the D/A output part thereby to allow the output voltage of the D/A converter 15 to be held. In this case, charge sharing by the capacitance 204 and the load capacitance 203 is caused in the charge and discharge corresponding to the offset of operational amplifier OP4, which makes possible to speed up the charge and discharge in offset correction. Incidentally, while the capacitance 204 is externally added to an external terminal of the chip, the capacitance 204 may be provided inside the chip to eliminate the need for the external terminal to externally add the capacitance 204. This enables the reduction in the number of external terminals of the chip and cost.

The provision of the operational amplifier OP4 and the transfer switch SW7 connected in parallel with the operational amplifier OP4 enables the reduction in the current output from the D/A converter 15 and further the operational amplifier OP4 allows the external load to be driven at a high speed. Also, the transfer switch SW7 is used to carry out the offset correction of the operational amplifier OP4, whereby the precision of sampling analog signals can be improved. Further, non-overlap signals are used for controlling the operations of the operational amplifier OP4 and the transfer switch SW7 connected in parallel with the operational amplifier OP4, which makes possible to avoid an undesirable current flowing into the output terminal of the operational amplifier OP4 through the transfer switch SW7. Moreover, a rail-to-rail type operational amplifier is adopted as the operational amplifier OP4, which enables the output voltage of the operational amplifier OP4 to fluctuate almost up to the source voltage level. The operational amplifier OP4 and the transfer switch SW7 connected in parallel with the operational amplifier OP4 may be provided in a signal output stage of the D/A converter 15, thereby to arrange the D/A converter so as to output results of the D/A conversion through the operational amplifier OP4 to the outside.

In the case where the invention is applied to a logic LSI, such as the microcomputer shown in FIG. 2, the following actions can be done rapidly: converting signals input from the A/D input part from analog to digital form and processing the resultant signals in a CPU; converting signals processed in the CPU from digital to analog form and outputting the resultant signals from the D/A output part; and converting signals input from the A/D input part from analog to digital form, processing the resultant signals in the CPU, and then converting the processed signals from digital to analog form to output the resultant signals.

In the above description, the invention that the inventor made has been described principally focusing on the case where the invention is applied to a microcomputer that is a background of the invention and is in the applicable field of the invention. However, the invention is not so limited and is widely applicable to various types of semiconductor integrated circuits.

The invention can be applied at least conditionally on the execution of the conversion between an analog signal and a digital signal.

What is claimed is:

1. A microcomputer comprising:
   a central processing unit which carries out a predetermined operation process according to a program;
   an external terminal for receiving an analog signal;
   an A/D converter capable of converting the analog signal received from said external terminal into a digital signal; and
   an internal bus which is coupled to the central processing unit and the A/D converter,
   said A/D converter including:
   a ladder-type resistor for generating a reference voltage,
   a first operational amplifier which receives different output voltages of said ladder-type resistor,
   a first switch which is capable of short-circuiting an input terminal and an output terminal of the first operational amplifier, and
   a comparator circuit for comparing an output voltage of the first operational amplifier with the analog signal.

2. The microcomputer according to claim 1,
   wherein the first operational amplifier and the first switch are actuated according to non-overlapping signals with respective timings different from each other.

3. The microcomputer according to claim 1,
   wherein said ladder-type resistor includes a plurality of resistors connected in series one another; and first capacitors, each provided at a corresponding node of the plurality of resistors and charged by an output voltage from the node.

4. The microcomputer according to claim 1,
   wherein the first operational amplifier includes a first transfer circuit for bringing the output terminal of the first operational amplifier to a high impedance condition according to an input control signal.

5. The microcomputer according to claim 1,
   wherein said first operational amplifier is of rail-to-rail type.

6. The microcomputer according to claim 1, further comprising a second operational amplifier between said external terminal and said comparator circuit.

7. The microcomputer according to claim 6, further comprising a second switch capable of short-circuiting an input terminal and an output terminal of said second operational amplifier.

8. The microcomputer according to claim 7,
   wherein said second operational amplifier and second switch are actuated according to non-overlapping signals with respective timings different from each other.

9. The microcomputer according to claim 6,
   wherein said second operational amplifier includes a second transfer circuit for bringing the output terminal of said second operational amplifier to a high impedance condition according to an input control signal.

10. The microcomputer according to claim 6,
wherein said second operational amplifier is of rail-to-rail type.

11. The microcomputer according to claim 1, further comprising:
a D/A converter for converting an input digital signal into an analog signal; and
a third operational amplifier placed in a subsequent stage of said D/A converter for driving an external load based on an output of said D/A converter.

12. The microcomputer according to claim 11, further comprising a third switch capable of short-circuiting an input terminal and an output terminal of said third operational amplifier.

13. The microcomputer according to claim 12,
wherein said third operational amplifier and third switch are actuated according to non-overlapping signals with respective timings different from each other.

14. The microcomputer according to claim 11,
wherein said third operational amplifier includes a third transfer circuit for bringing the output terminal of said third operational amplifier to a high impedance condition according to an input control signal.

15. The microcomputer according to claim 11,
wherein said third operational amplifier is of rail-to-rail type.

16. The microcomputer according to claim 11, further comprising a second capacitor in parallel with said third operational amplifier and located in the subsequent stage of said D/A converter.

17. The microcomputer according to claim 1, further comprising a random access memory which is used as a work area for the central processing unit, an input-output circuit which is capable of receiving or outputting various signals,
wherein the A/D converter, the external terminal, the central processing unit, the random access memory, the input-output circuit and the internal bus are formed on a single semiconductor chip, and
wherein the internal bus is coupled to the random access memory and the input-output circuit.

18. The microcomputer according to claim 17, further comprising a flash memory to which the program is stored.

19. The microcomputer according to claim 1, including a plurality of said external terminals and an analog multiplexer which selects an analog signal from one of the plurality of external terminals and transfers the selected analog signal to the comparator.

20. The microcomputer according to claim 17, wherein the internal bus includes a control bus to which various control signals are transmitted and a peripheral data bus to which a conversion result of the A/D converter is output.

21. The microcomputer according to claim 1, further comprising a fourth operational amplifier and a fourth switch,
wherein the first operational amplifier is capable of receiving a selected reference voltage of the ladder-type resistor by an upper bit decoder,
wherein the fourth operational amplifier is capable of receiving a selected reference voltage of the ladder-type resistor by a lower bit decoder, and
wherein the fourth switch is capable of short-circuiting an input terminal and an output terminal of the fourth operational amplifier.

22. The microcomputer according to claim 21, wherein the comparator circuit includes a first capacitor for receiving an output from the first operational amplifier and a second capacitor for receiving an output from the fourth operational amplifier.

23. A microcomputer comprising:
a central processing unit which carries out a predetermined operation process according to a program;
an external terminal for receiving an analog signal;
an A/D converter capable of converting the analog signal received from said external terminal into a digital signal; and
an internal bus which is coupled to the central processing unit and the A/D converter, said A/D converter including:
a ladder-type resistor,
a first operational amplifier which receives a selected reference voltage of said ladder-type resistor by a decoder and is capable of bringing an output terminal of said first operational amplifier to a high impedance condition according to an input control signal,
a first switch which is capable of selecting the selected reference voltage of said ladder-type resistor from an antecedent stage of the first operational amplifier or the analog signal from the external terminal, and
a comparator circuit for comparing an output voltage of the first operational amplifier with the analog signal.

24. A microcomputer comprising:
a central processing unit which carries out a predetermined operation process according to a program;
an external terminal for receiving an analog signal;
an A/D converter capable of converting the analog signal received from said external terminal into a digital signal;
an internal bus which is coupled to the central processing unit and the A/D converter,
said A/D converter including:
a ladder-type resistor,
a first operational amplifier,
a first switch,
a comparator circuit,
a first path between the ladder-type resistor and a comparator circuit, and on which a first operational amplifier receives a selected reference voltage of said ladder-type resistor by a decoder, and
a second path between the ladder-type resistor and the comparator circuit, and on which a first switch is capable of electrically coupling between the ladder-type resistor and the comparator circuit,
wherein the comparator circuit is arranged for comparing an output voltage of the first operational amplifier with the analog signal.

25. A microcomputer comprising:
a central processing unit which carries out a predetermined operation process according to a program;
a random access memory which is used as a work area for the central processing unit;
a nonvolatile memory to which the program is stored;
an A/D converter capable of converting an analog signal into a digital signal; and
an internal bus which is coupled to the central processing unit, the random access memory, the nonvolatile memory and the A/D converter,
said A/D converter including:
a ladder-type resistor from which a reference voltage is selected by a decoder,
a first operational amplifier which receives the selected reference voltage,
a first switch which is capable of short-circuiting an input terminal and an output terminal of the first operational amplifier, and
a comparator circuit for comparing an output voltage of the first operational amplifier with the analog signal.

* * * * *